(12) United States Patent
Sugita et al.

(10) Patent No.: US 10,634,479 B2
(45) Date of Patent: *Apr. 28, 2020

(54) MEASURING INSTRUMENT FOR MEASURING ELECTROSTATIC CAPACITY AND METHOD OF CALIBRATING TRANSFER POSITION DATA IN PROCESSING SYSTEM BY USING MEASURING INSTRUMENT

(71) Applicant: TOKYO ELECTRON LIMITED, Tokyo (JP)

(72) Inventors: Kippei Sugita, Miyagi (JP); Tomohide Minami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 334 days.

This patent is subject to a terminal disclaimer.

(21) Appl. No.: 15/623,109

(22) Filed: Jun. 14, 2017

(65) Prior Publication Data
US 2017/0363407 A1 Dec. 21, 2017

(30) Foreign Application Priority Data

Jun. 20, 2016 (JP) .................................. 2016-121714
Oct. 24, 2016 (JP) .................................. 2016-207649

(51) Int. Cl.
*G01B 7/00* (2006.01)
*H01L 21/67* (2006.01)
(Continued)

(52) U.S. Cl.
CPC ........ *G01B 7/003* (2013.01); *H01L 21/67253* (2013.01); *H01L 21/67259* (2013.01);
(Continued)

(58) Field of Classification Search
CPC .............. G01B 7/003; H01L 21/67253; H01L 21/68742; H01L 21/681; H01L 21/67742;
(Continued)

(56) References Cited

U.S. PATENT DOCUMENTS 6,333,572 B1 * 12/2001 Ono ..................... G03F 7/70716
310/12.06
7,884,622 B2 * 2/2011 Doki ..................... G03F 7/7075
324/658
(Continued)

FOREIGN PATENT DOCUMENTS

JP 4956328 B2 6/2012

*Primary Examiner* — Mohammad K Islam
(74) *Attorney, Agent, or Firm* — Studebaker & Brackett PC

(57) ABSTRACT

Provided is a measuring instrument for measuring an electrostatic capacity. The measuring instrument includes a base substrate having a disk shape, a plurality of first sensors arranged along an edge of the base substrate and respectively provide a plurality of side electrodes, one or more second sensors each of which has a bottom electrode provided along a bottom surface of the base substrate, and a circuit board. The circuit board is configured to apply a high frequency signal to the plurality of side electrodes and the bottom electrode, to generate a plurality of first measurement values respectively indicating electrostatic capacities based on voltage amplitudes in the plurality of side electrodes, and to generate a second measurement value indicating an electrostatic capacity based on a voltage amplitude in the bottom electrode.

12 Claims, 22 Drawing Sheets

(51) Int. Cl.
*G01R 29/12* (2006.01)
*H01L 21/683* (2006.01)
*H01L 21/687* (2006.01)
*H01L 21/677* (2006.01)
*H01L 21/68* (2006.01)
*G01R 27/26* (2006.01)

(52) U.S. Cl.
CPC ...... *H01L 21/67742* (2013.01); *H01L 21/681* (2013.01); *H01L 21/6831* (2013.01); *H01L 21/68742* (2013.01); *G01R 27/2605* (2013.01); *G01R 29/12* (2013.01); *H01L 21/67069* (2013.01); *H01L 21/67167* (2013.01)

(58) Field of Classification Search
CPC ........... H01L 21/67259; H01L 21/6831; H01L 21/67069; H01L 21/67167; G01R 27/2605; G01R 29/12
See application file for complete search history.

(56) References Cited

U.S. PATENT DOCUMENTS

| | | | |
|---|---|---|---|
| 2005/0073323 A1* | 4/2005 | Kohno | G01R 27/2605 324/662 |
| 2009/0086879 A1* | 4/2009 | Ogata | G01D 5/2417 377/17 |
| 2014/0111189 A1* | 4/2014 | Makuth | G01R 29/12 324/123 R |
| 2014/0268342 A1* | 9/2014 | Matsushita | G01J 3/0229 359/578 |
| 2015/0132863 A1* | 5/2015 | Oohashi | H02N 13/00 438/5 |
| 2017/0166236 A1* | 6/2017 | Iguchi | B62D 1/046 |
| 2018/0261486 A1* | 9/2018 | Anada | H01L 21/67109 |

* cited by examiner

MEASURING INSTRUMENT FOR MEASURING ELECTROSTATIC CAPACITY AND METHOD OF CALIBRATING TRANSFER POSITION DATA IN PROCESSING SYSTEM BY USING MEASURING INSTRUMENT

CROSS-REFERENCE TO RELATED APPLICATIONS

This application is based on and claims the benefit of priority from Japanese Patent Application No. 2016-121714 filed on Jun. 20, 2016, and Japanese Patent Application No. 2016-207649 filed on Oct. 24, 2016, the entire contents of which are incorporated herein by reference.

FIELD

Exemplary embodiments of the present disclosure relate to a measuring instrument for measuring an electrostatic capacity and a method of calibrating transfer position data in a processing system by using the measuring instrument.

BACKGROUND

In manufacturing an electronic device such as a semiconductor device, a processing system in which a disk-shaped workpiece is processed has been used. The processing system has a transfer unit for transferring the workpiece and a processing apparatus for processing the workpiece. Generally, the processing apparatus has a chamber body and a placement stage which is provided inside the chamber body. The placement stage is configured to support the workpiece which is placed thereon. The transfer unit is configured to transfer the workpiece to a location on the placement stage.

In processing the workpiece by the processing apparatus, the position of the workpiece on the placement stage is important. Therefore, in a case where the position of the workpiece on the placement stage deviates from a predetermined position, it is necessary to adjust the transfer unit.

As a technology of adjusting the transfer unit, there is a known technology disclosed in Japanese Patent Publication No. 4956328. According to the technology disclosed in Japanese Patent Publication No. 4956328, a recessed portion is formed on the placement stage. In addition, according to the technology disclosed in Japanese Patent Publication No. 4956328, a measuring instrument having a disk shape same as that of the workpiece and having an electrode for measuring an electrostatic capacity is utilized. According to the technology disclosed in Japanese Patent Publication No. 4956328, the measuring instrument is transferred to a location on the placement stage by the transfer unit, a measurement value of the electrostatic capacity depending on a relative positional relationship between the recessed portion and the electrode is acquired, and the transfer unit is adjusted to correct a transfer position of the workpiece based on the measurement value.

SUMMARY

In an aspect, there is provided a measuring instrument for measuring an electrostatic capacity. The measuring instrument includes a base substrate, a plurality of first sensors, one or more second sensors, and a circuit board. The base substrate has a disk shape. The plurality of first sensors are arranged along an edge of the base substrate and respectively provide a plurality of side electrodes. Each of the one or more second sensors has a bottom electrode provided along a bottom surface of the base substrate. The circuit board is mounted on the base substrate and is connected to each of the plurality of first sensors and the one or more second sensors. The circuit board is configured to apply a high frequency signal to the plurality of side electrodes and the bottom electrode, to generate a plurality of first measurement values respectively indicating electrostatic capacities based on voltage amplitudes in the plurality of side electrodes, and to generate a second measurement value indicating an electrostatic capacity based on a voltage amplitude in the bottom electrode.

In another aspect, there is provided a method of calibrating transfer position data in a processing system by using the measuring instrument. The processing system includes a processing apparatus and a transfer unit. The processing apparatus has a chamber body and an electrostatic chuck. The electrostatic chuck is provided inside a chamber provided by the chamber body. The electrostatic chuck has a placement region having a circular edge. The workpiece is placed on the placement region. The transfer unit transfers the workpiece to a location on the placement region based on the transfer position data. The method includes a step of transferring the measuring instrument by using the transfer unit to a position on the placement region identified by the transfer position data; a step of measuring three or more electrostatic capacities by using the three or more second sensors of the measuring instrument transferred to a location on the placement region; a step of obtaining an error of the position on the placement region to which the measuring instrument is transferred, with respect to a predetermined transfer position on the placement region based on the measurement values of the three or more electrostatic capacities; and a step of calibrating the transfer position data by using the error.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF TUE DRAWINGS

Figure 22A:
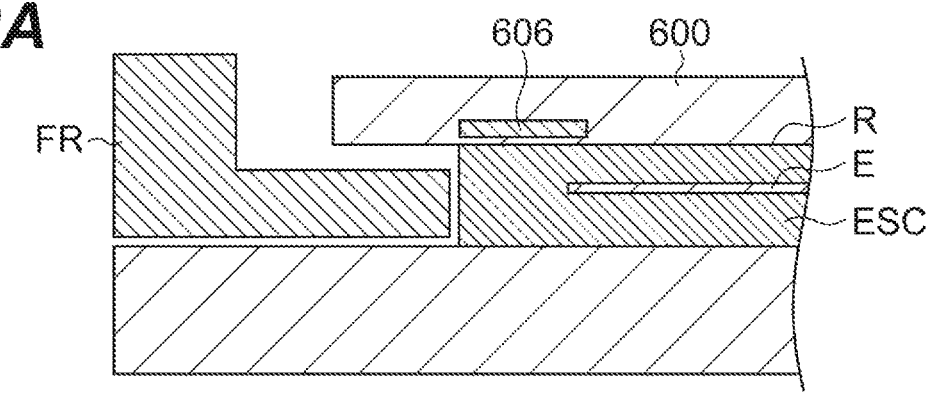
Figure 22B:
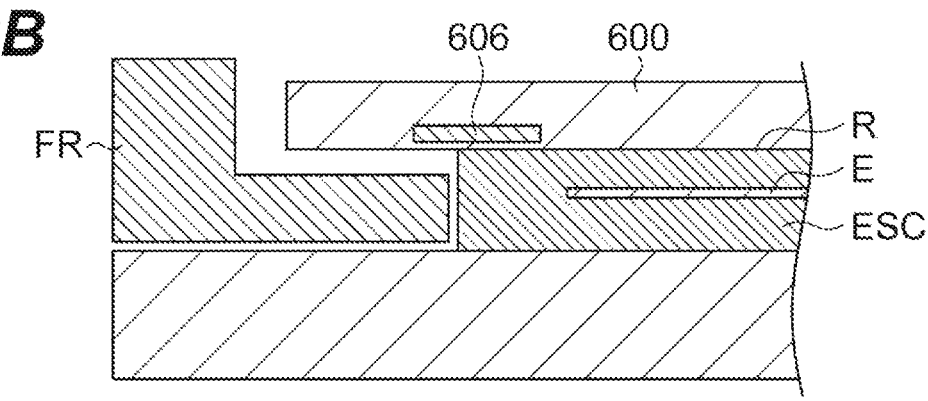
Figure 22C:
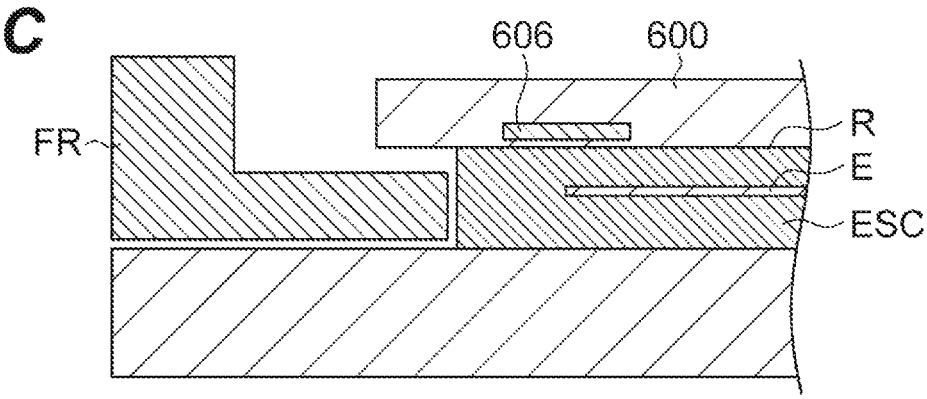

FIGS. 22A, 22B, and 22C are views illustrating a transfer position of the measuring instrument with respect to the electrostatic chuck.

DETAILED DESCRIPTION

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

As a processing apparatus of a processing system, a plasma processing apparatus may be used. The plasma processing apparatus includes a chamber body and a placement stage. In addition, in the plasma processing apparatus, a focus ring is provided on the placement stage to surround an edge of a workpiece. The focus ring is an annular plate extending in a circumferential direction with respect to a central axis and is formed of silicon, for example.

In plasma processing performed on the workpiece by using the plasma processing apparatus, a positional relationship between the focus ring and the workpiece is important. For example, when the position of the disk-shaped workpiece deviates with respect to the focus ring, and the size of a gap between the focus ring and an edge of the workpiece varies in the circumferential direction, plasma enters a portion where a large gap is generated and causes particles to be generated on the workpiece. Therefore, it is important to acquire highly reliable data reflecting the positional relationship between a workpiece transferred by a transfer unit, and the focus ring.

In an aspect, there is provided a measuring instrument for measuring an electrostatic capacity. The measuring instrument includes a base substrate, a plurality of first sensors, one or more second sensors, and a circuit board. The base substrate has a disk shape. The plurality of first sensors are arranged along an edge of the base substrate and respectively provide a plurality of side electrodes. Each of the one or more second sensors has a bottom electrode provided along a bottom surface of the base substrate. The circuit board is mounted on the base substrate and is connected to each of the plurality of first sensors and the one or more second sensors. The circuit board is configured to apply a high frequency signal to the plurality of side electrodes and the bottom electrode, to generate a plurality of first measurement values respectively indicating electrostatic capacities based on voltage amplitudes in the plurality of side electrodes, and to generate a second measurement value indicating an electrostatic capacity based on a voltage amplitude in the bottom electrode.

In the measuring instrument according to the aspect, the plurality of side electrodes provided by the plurality of first sensors are arranged along the edge of the base substrate. In a state where the measuring instrument is disposed in a region surrounded by a focus ring, the plurality of side electrodes face an inner edge of the focus ring. The plurality of first measurement values respectively generated based on the voltage amplitudes in the side electrodes indicate the electrostatic capacities reflecting the distances from the respective side electrodes to the focus ring. Therefore, according to the measuring instrument, measurement data reflecting a relative positional relationship between the measuring instrument copying a workpiece, and the focus ring can be obtained. In addition, in the measuring instrument, the bottom electrode of each of the one or more second sensors is disposed along the bottom surface of the base substrate. The second measurement value generated based on the voltage amplitude in the bottom electrode indicates the electrostatic capacity between the bottom electrode and a substance below the measuring instrument. That is, the second measurement value reflects the relative positional relationship between the bottom electrode and the substance below the measuring instrument. Therefore, according to the second measurement value, it is possible to check whether or not the measuring instrument is disposed on the placement stage within a region surrounded by the focus ring. It is possible to confirm the reliability of the above-described first measurement values by using the second measurement value.

In an exemplary embodiment, the bottom electrode of each of the one or more second sensors has a circle shape. Each of the one or more second sensors further includes peripheral electrodes disposed to surround the bottom electrode. The circuit board is further configured to apply the high frequency signal to the peripheral electrodes and to generate third measurement values indicating electrostatic capacities based on voltage amplitudes in the peripheral electrodes.

In an exemplary embodiment, the one or more second sensors are a plurality of the second sensors. The plurality of second sensors are disposed along a circle sharing a central axis of the base substrate.

In an exemplary embodiment, each of the one or more second sensors further includes a plurality of electrodes provided in the base substrate to extend from a top surface of the base substrate in a plate-thickness direction of the base substrate. The bottom electrode of each of the one or more second sensors is formed with end surfaces of the plurality of electrodes on the bottom surface side.

In an exemplary embodiment, each of the one or more second sensors further includes one or more through electrodes penetrating the base substrate. The bottom electrode of each of the one or more second sensors is connected to the circuit board via the one or more through electrodes.

In an exemplary embodiment, the one or more second sensors are three or more second sensors. Each of the three or more second sensors is disposed along a circle sharing the central axis of the base substrate. A portion of an edge of the bottom electrode of each of the three or more second sensors has an arc shape and extends on the circle.

In another aspect, there is provided a method of calibrating transfer position data in a processing system by using the measuring instrument. The processing system includes a processing apparatus and a transfer unit. The processing apparatus has a chamber body and an electrostatic chuck. The electrostatic chuck is provided inside a chamber provided by the chamber body. The electrostatic chuck has a placement region having a circular edge. The workpiece is placed on the placement region. The transfer unit transfers the workpiece to a location on the placement region based on the transfer position data. The method includes a step of transferring the measuring instrument by using the transfer unit to a position on the placement region identified by the transfer position data; a step of measuring three or more electrostatic capacities by using the three or more second sensors of the measuring instrument transferred to a location on the placement region; a step of obtaining an error of the position on the placement region to which the measuring instrument is transferred, with respect to a predetermined transfer position on the placement region based on the measurement values of the three or more electrostatic capacities; and a step of calibrating the transfer position data by using the error.

In an exemplary embodiment, the curvature of the portion of the edge of the bottom electrode coincides with the curvature of the edge of the placement region.

Hereinafter, various embodiments will be described in detail with reference to the drawings. In the drawing, the same or equivalent portions are denoted by the same reference symbols.

Figure 1:
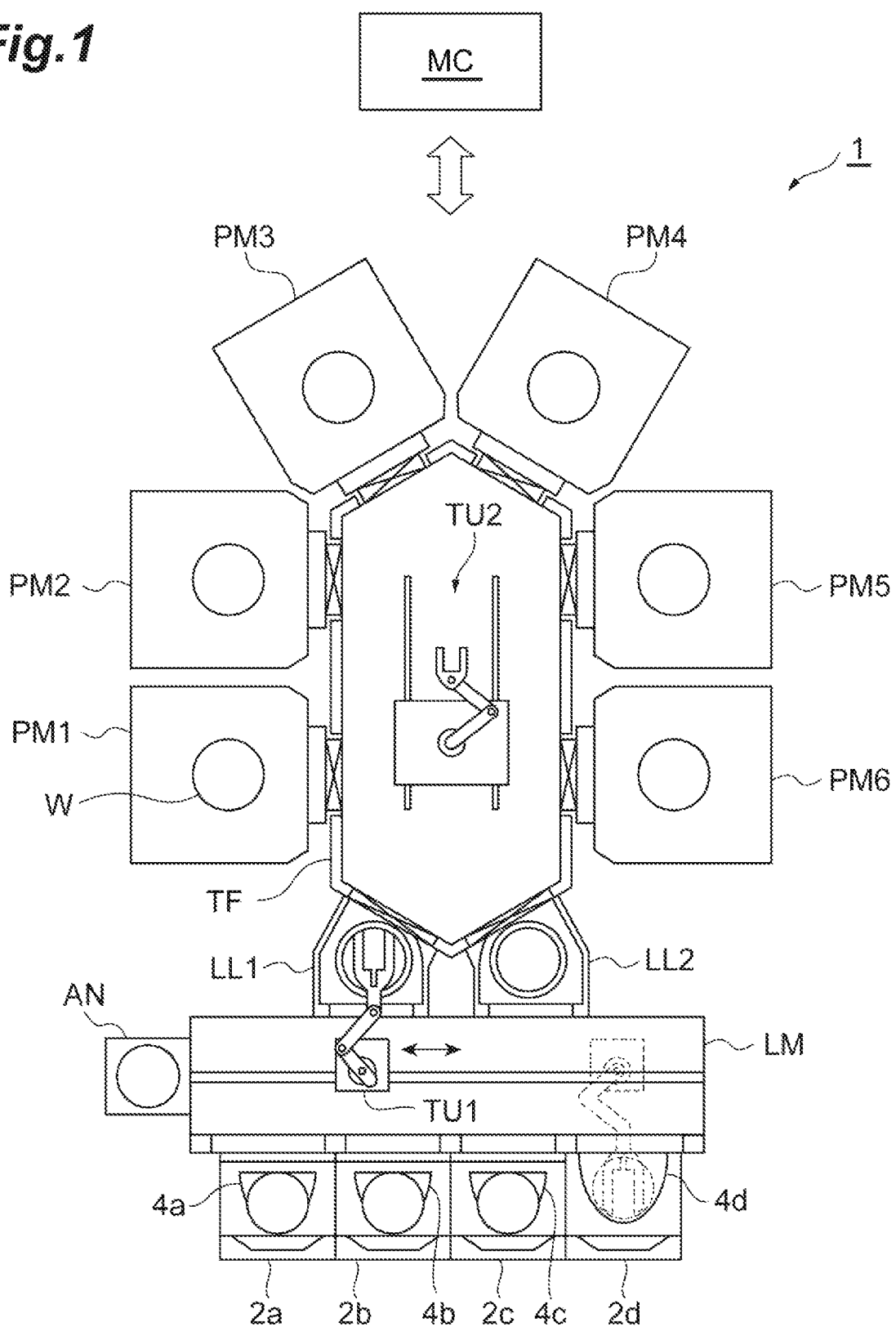
FIG. 1 is a view illustrating an exemplary processing system.

First, a processing system having a processing apparatus for processing disk-shaped workpiece, and a transfer unit for transferring a workpiece to the processing apparatus will be described. FIG. 1 is a view illustrating an exemplary processing system. A processing system 1 includes stands 2a to 2d, containers 4a to 4d, a loader module LM, an aligner AN, load lock modules LL1 and LL2, process modules PM1 to PM6, a transfer module TF, and a controller MC. The number of the stands 2a to 2d, the number of the containers 4a to 4d, the number of the load lock modules LL1 and LL2, and the number of the process modules PM1 to PM6 are not limited and can be an arbitrary number of one or more.

The stands 2a to 2d are arranged along one edge of the loader module LM. The containers 4a to 4d are respectively mounted on the stands 2a to 2d. For example, each of the containers 4a to 4d is a container referred to as a front opening unified pod (FOUP). Each of the containers 4a to 4d is configured to accommodate a workpiece W therein. The workpiece W has a substantial disk shape such as a wafer.

The loader module LM has a chamber wall which defines a transfer space under an atmospheric pressure condition therein. A transfer unit TU1 is provided in the transfer space. For example, the transfer unit TU1 is an articulated robot, which is controlled by the controller MC. The transfer unit TU1 is configured to transfer the workpiece W between the each of containers 4a to 4d and the aligner AN, between the aligner AN and each of the load lock modules LL1 and LL2, and between each of the load lock modules LL1 and LL2 and each of the containers 4a to 4d.

Figure 2:
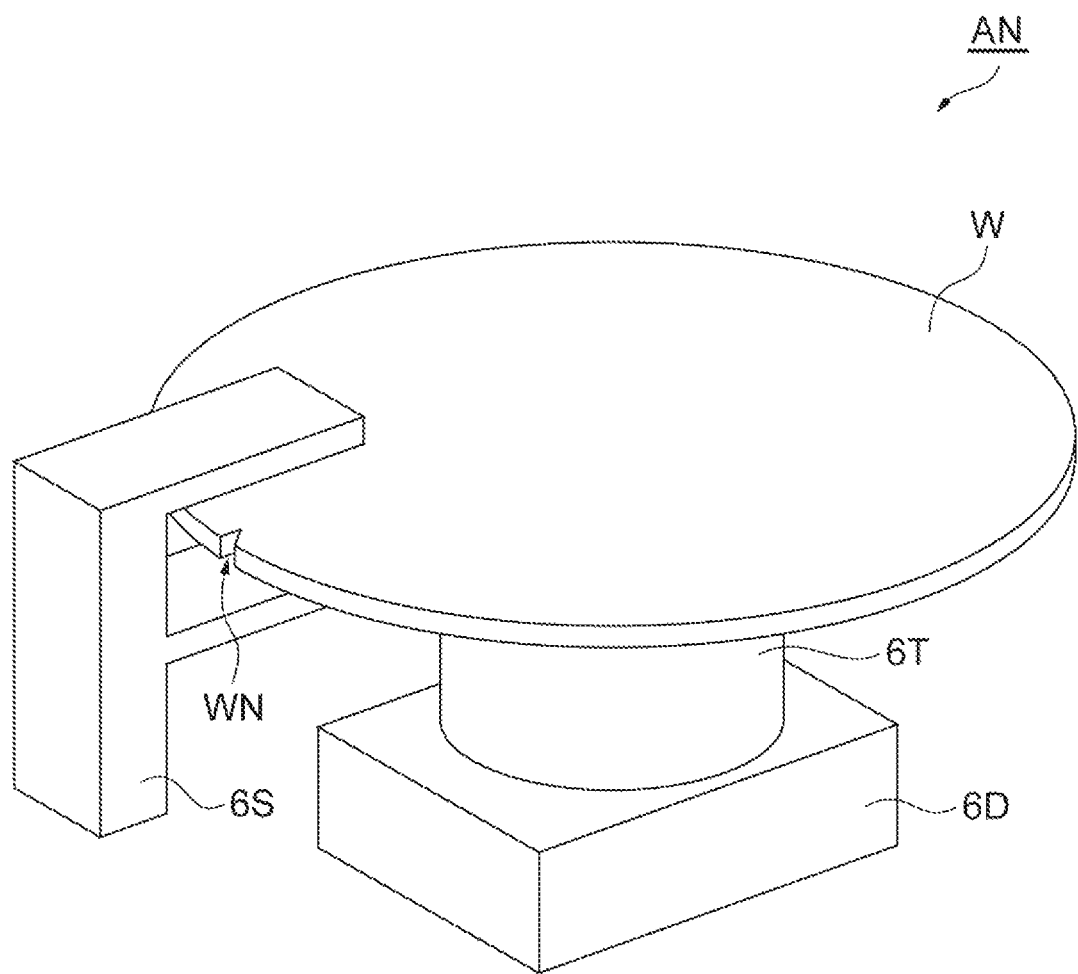
FIG. 2 is a perspective view illustrating an exemplary aligner.

The aligner AN is connected to the loader module LM. The aligner AN is configured to adjust the position (to calibrate the position) of the workpiece W. FIG. 2 is a perspective view illustrating an exemplary aligner. The aligner AN has a support stand 6T, a driving unit 6D, and a sensor 6S. The support stand 6T is a stand capable of rotating around an axis extending in a vertical direction and is configured to support the workpiece W thereon. The support stand 6T is rotated by the driving unit 6D. The driving unit 6D is controlled by the controller MC. When the support stand 6T rotates due to power from the driving unit 6D, the workpiece W placed on the support stand 6T also rotates.

The sensor 6S is an optical sensor, which detects an edge of the workpiece W while the workpiece W is rotated. From the detection result of the edge, the sensor 6S detects the amount of deviation of an angle position of a notch WN (or different type of marker) of the workpiece W with respect to a reference angle position, and the amount of deviation of a central position of the workpiece W with respect to a reference position. The sensor 6S outputs the amount of deviation of the angle position of the notch WN and the amount of deviation of the central position of the workpiece W to the controller MC. The controller MC calculates the rotation amount of the support stand 6T for correcting the angle position of the notch WN to the reference angle position based on the amount of deviation of the angle position of the notch WN. The controller MC controls the driving unit 6D such that the support stand 6T is rotated by the rotation amount. Accordingly, the angle position of the notch WN can be corrected to the reference angle position. In addition, the controller MC controls the position of an end effector of the transfer unit TU1 at the time of receiving the workpiece W from the aligner AN, based on the amount of deviation of the central position of the workpiece W such that the central position of the workpiece W coincides with a predetermined position on the end effector of the transfer unit TU1.

Referring to FIG. 1 again, each of the load lock module LL1 and the load lock module LL2 is provided between the loader module LM and the transfer module TF. Each of the load lock module LL1 and the load lock module LL2 provides a preliminary depressurization chamber.

The transfer module TF is connected to the load lock module LL1 and the load lock module LL2 via gate valves. The transfer module TF provides a depressurization chamber capable of being depressurized. A transfer unit TU2 is provided in the depressurization chamber. For example, the transfer unit TU2 is an articulated robot, which is controlled by the controller MC. The transfer unit TU2 is configured to transfer the workpiece W between each of the load lock modules LL1 and LL2 and each of the process modules PM1 to PM6, and between two arbitrary process modules among the process modules PM1 to PM6.

The process modules PM1 to PM6 are connected to the transfer module TF via gate valves. Each of the process modules PM1 to PM6 is a processing apparatus configured to perform dedicated processing such as plasma processing with respect to the workpiece W.

A series of operations at the time of processing the workpiece W in the processing system 1 is exemplified as follows. The transfer unit TU1 of the loader module LM takes out the workpiece W from any of the containers 4a to 4d and transfers the workpiece W to the aligner AN. Subsequently, the transfer unit TU1 takes out the position-adjusted workpiece W from the aligner AN and transfers the workpiece W to one load lock module out of the load lock module LL1 and the load lock module LL2. Subsequently, in the one load lock module, the pressure in the preliminary depressurization chamber is depressurized to a predetermined pressure. Subsequently, the transfer unit TU2 of the transfer module TF takes out the workpiece W from the one load lock module and transfers the workpiece W to any of the process modules PM1 to PM6. The workpiece W is processed by one or more process modules among the process modules PM1 to PM6. The transfer unit TU2 transfers the processed workpiece W from the process module to one load lock module out of the load lock module LL1 and the load lock module LL2. Subsequently, the transfer unit TU1 transfers the workpiece W from the one load lock module to any of the containers 4a to 4d.

As described above, the processing system 1 includes the controller MC. The controller MC may be a computer including a processor, a storage device such as a memory, a display device, an input/output device, a communication device, and the like. A series of the above-described operations of the processing system 1 is realized by the controller MC controlling each portion of the processing system 1 in accordance with a program stored in the storage device.

Figure 3:
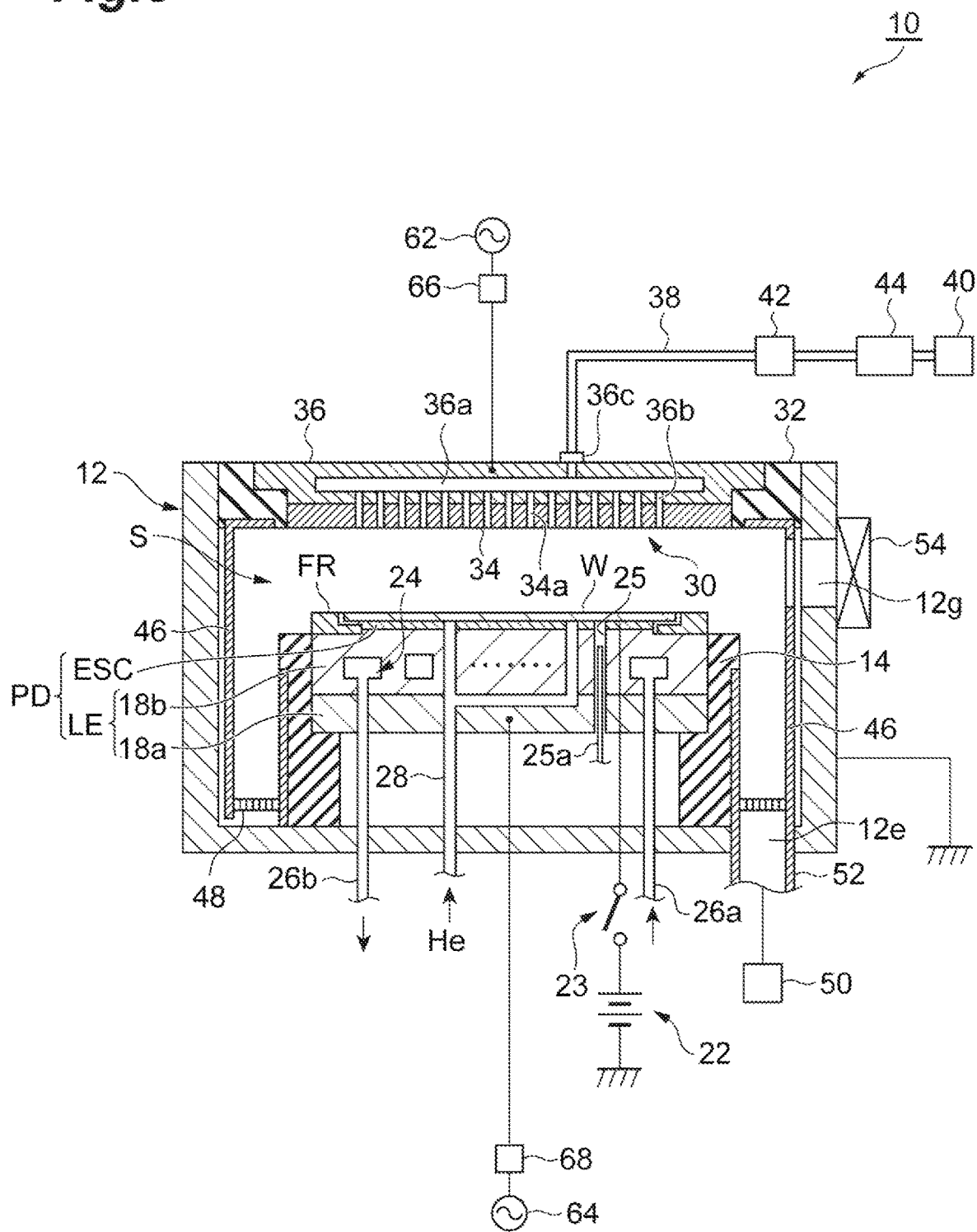
FIG. 3 is a view illustrating an example of a plasma processing apparatus.

FIG. 3 is a view illustrating an example of the plasma processing apparatus which can be employed as any of the process modules PM1 to PM6. A plasma processing apparatus 10 illustrated in FIG. 3 is a capacitive coupling-type plasma etching apparatus. The plasma processing apparatus 10 includes a substantially cylindrical chamber body 12. For example, the chamber body 12 is formed of aluminum, and an inner wall surface thereof may be subjected to anodic oxidation. The chamber body 12 is grounded.

A substantially cylindrical support portion 14 is provided on a bottom portion of the chamber body 12. For example, the support portion 14 is formed of an insulating material. The support portion 14 is provided inside the chamber body 12 and extends upward from the bottom portion of the chamber body 12. In addition, a placement stage PD is provided inside a chamber S provided by the chamber body 12. The placement stage PD is supported by the support portion 14.

The placement stage PD has a lower electrode LE and an electrostatic chuck ESC. The lower electrode LE includes a first plate 18a and a second plate 18b. For example, the first plate 18a and the second plate 18b are formed of metal such as aluminum and have substantial disk shapes. The second plate 18b is provided on the first plate 18a and is electrically connected to the first plate 18a.

The electrostatic chuck ESC is provided on the second plate 18b. The electrostatic chuck ESC has a structure in which an electrode (conductive film) is disposed between a pair of insulating layers or insulating sheets and has a substantial disk shape. A DC power source 22 is electrically connected to the electrode of the electrostatic chuck ESC via a switch 23. The electrostatic chuck ESC attract the workpiece W to the electrostatic chuck ESC due to an electrostatic force such as a Coulomb's force generated by a DC voltage from the DC power source 22. Accordingly, the electrostatic chuck ESC can hold the workpiece W.

A focus ring FR is provided on a circumferential edge portion of the second plate 18b. The focus ring FR is provided to surround the edge of the workpiece W and the electrostatic chuck ESC. The focus ring FR has a first portion P1 and a second portion P2 (refer to FIG. 8). The first portion P1 and the second portion P2 have annular plate shapes. The second portion P2 is provided on the first portion P1. An inner edge P2i of the second portion P2 has a diameter greater than the diameter of the inner edge P1i of the first portion P1. The workpiece W is placed on the electrostatic chuck ESC such that an edge region thereof is positioned on or above the first portion P1 of the focus ring FR. The focus ring FR may be formed of any of various types of materials such as silicon, silicon carbide, and silicon oxide.

A refrigerant flow channel 24 is provided in the second plate 18b. The refrigerant flow channel 24 configures a temperature control mechanism. A refrigerant is supplied to the refrigerant flow channel 24 via a pipe 26a from a chiller unit provided outside the chamber body 12. The refrigerant supplied to the refrigerant flow channel 24 returns to the chiller unit via a pipe 26b. In this manner, the refrigerant circulates between the refrigerant flow channel 24 and the chiller unit. The temperature of the workpiece W supported by the electrostatic chuck ESC is controlled by controlling the temperature of the refrigerant.

A plurality (for example, three) of through holes 25 penetrating the placement stage PD are formed in the placement stage PD. A plurality (for example, three) of lift pins 25a are respectively inserted into the plurality of through holes 25. FIG. 3 depicts one through hole 25 in which one lift pin 25a is inserted.

Figure 4:
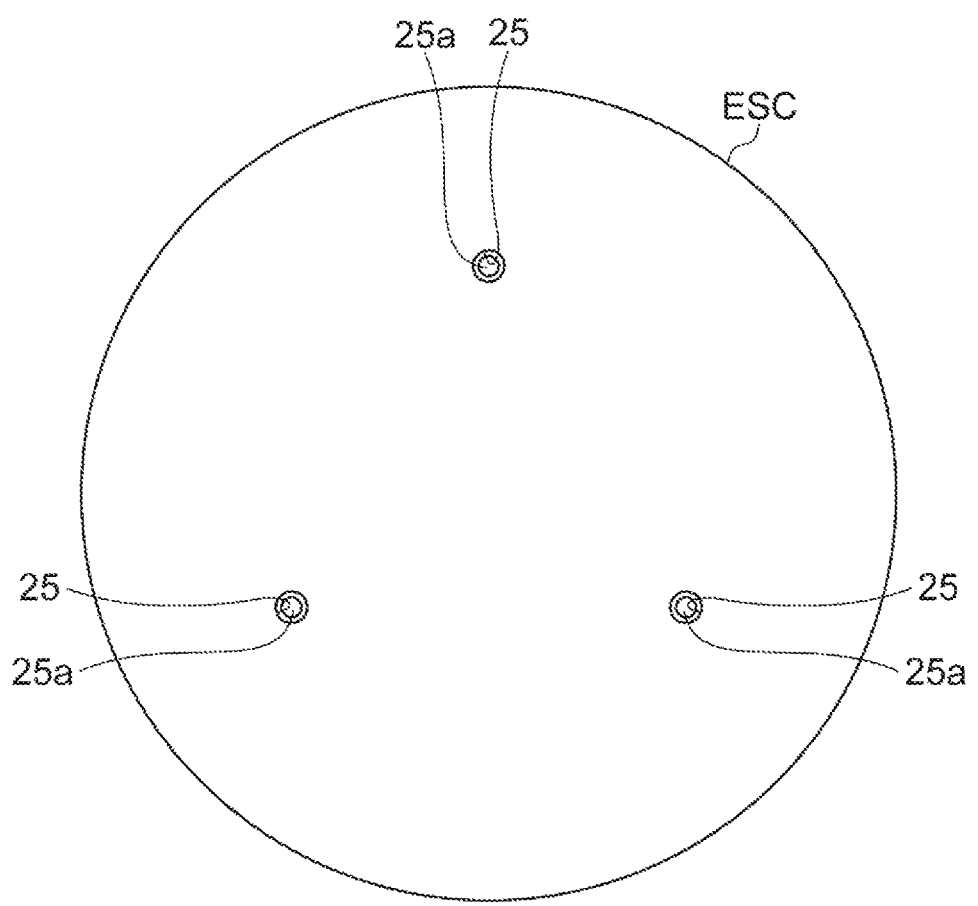
FIG. 4 is a plan view illustrating an exemplary electrostatic chuck.

FIG. 4 is a plan view illustrating the electrostatic chuck ESC which configures the placement stage PD. As illustrated in FIG. 4, the plurality of lift pins 25a are respectively disposed along a plurality of straight lines which are orthogonal to a circle sharing a central axis of the electrostatic chuck ESC, that is, a central axis of the placement stage PD and extend in the vertical direction. The plurality of lift pins 25a may be disposed at equal distances in a circumferential direction with respect to the central axis. For example, the lift pins 25a are supported by a link which is moved up and down by an actuator. In a state where the tip ends of the lift pins 25a protrude above the electrostatic chuck ESC, the workpiece W is supported by the tip ends of the lift pins 25a. Thereafter, the lift pins 25a are moved down, and the workpiece W is thereby placed on the electrostatic chuck ESC. In addition, the lift pins 25a are moved up after plasma processing of the workpiece W, and the workpiece W is thereby separated from the electrostatic chuck ESC. That is, the lift pins 25a are used for loading and unloading the workpiece W.

In addition, a gas supply line 28 is provided in the plasma processing apparatus 10. The gas supply line 28 supplies heat transfer gas, for example, He gas, from a heat transfer gas supply mechanism to a space between the top surface of the electrostatic chuck ESC and the back surface of the workpiece W.

In addition, the plasma processing apparatus 10 includes an upper electrode 30. The upper electrode 30 is disposed above the placement stage PD to face the placement stage PD. The upper electrode 30 is supported by an upper portion of the chamber body 12 via an insulation shielding member 32. The upper electrode 30 can include a top plate 34 and a support body 36. The top plate 34 faces the chamber S. A plurality of gas discharge holes 34a are provided in the top plate 34. The top plate 34 may be formed of silicon or quartz. Alternatively, the top plate 34 may be configured by forming a plasma resistant film such as yttrium oxide on the outer surface of an aluminum-made base material.

The support body 36 detachably supports the top plate 34. For example, the support body 36 may be formed of a conductive material such as aluminum. The support body 36 may have a water-cooling structure. A gas diffusion chamber 36a is provided inside the support body 36. A plurality of gas flow holes 36b communicating with the gas discharge holes 34a extend downward from the gas diffusion chamber 36a. In addition, a gas introduction port 36c introducing processing gas to the gas diffusion chamber 36a is formed in the support body 36. A gas supply pipe 38 is connected to the gas introduction port 36c.

A gas source group 40 is connected to the gas supply pipe 38 via a valve group 42 and a flow-rate controller group 44. The gas source group 40 contains a plurality of gas sources for plural types of gases. The valve group 42 includes a plurality of valves. The flow-rate controller group 44 includes a plurality of flow-rate controllers such as mass-flow controllers. Each of the plurality of gas sources of the gas source group 40 is connected to the gas supply pipe 38 via the corresponding valve of the valve group 42 and the corresponding flow-rate controller of the flow-rate controller group 44.

In addition, in the plasma processing apparatus 10, a shield 46 is detachably provided along an inner wall of the chamber body 12. The shield 46 is also provided in the outer circumference of the support portion 14. The shield 46 prevents by-products of etching from adhering to the chamber body 12. The shield 46 may be configured by covering an aluminum material with ceramics such as yttrium oxide.

An exhaust plate 48 is provided on the bottom portion side of the chamber body 12, that is, between the support portion 14 and a side wall of the chamber body 12. For example, the exhaust plate 48 may be configured by covering an aluminum material with ceramics such as yttrium oxide. A plurality of holes penetrating the exhaust plate 48 in the plate-thickness direction is formed in the exhaust plate 48. An exhaust port 12e is provided below the exhaust plate 48, that is, in the chamber body 12. An exhaust unit 50 is connected to the exhaust port 12e via an exhaust pipe 52. The exhaust device 50 has a pressure adjustment valve and a vacuum pump such as a turbo-molecular pump and can depressurize the space inside the chamber body 12 to a desired vacuum degree. In addition, an opening 12g for transfer-in and transfer-out of the workpiece W is provided in the side wall of the chamber body 12. The opening 12g can be opened and closed by a gate valve 54.

In addition, the plasma processing apparatus 10 further includes a first high frequency power source 62 and a second high frequency power source 64. The first high frequency power source 62 is a power source which generates a first high frequency wave for generating plasma, and generates, for example, a high frequency wave having a frequency ranging from 27 to 100 MHz. The first high frequency power source 62 is connected to the upper electrode 30 via a matching unit 66. The matching unit 66 has a circuit for matching output impedance of the first high frequency power source 62 and input impedance on a load side (upper electrode 30 side) together. The first high frequency power source 62 may be connected to the lower electrode LE via the matching unit 66.

The second high frequency power source 64 is a power source which generates a second high frequency wave for attracting ion to the workpiece W, and generates, for example, a high frequency wave having a frequency within a range from 400 kHz to 13.56 MHz. The second high frequency power source 64 is connected to the lower electrode LE via a matching unit 68. The matching unit 68 has a circuit for matching output impedance of the second high frequency power source 64 and input impedance on the load side (lower electrode LE side) together.

In the plasma processing apparatus 10, a gas from one or more gas sources selected from the plurality of gas sources is supplied to the chamber S. In addition, the pressure of the chamber S is set to a predetermined pressure by the exhaust device 50. Moreover, a gas inside the chamber S is excited by the first high frequency from the first high frequency power source 62. Accordingly, plasma is generated. The workpiece W is processed by the generated active species. As necessary, ion may be attracted to the workpiece W due to a bias based on the second high frequency wave of the second high frequency power source 64.

Figure 5:
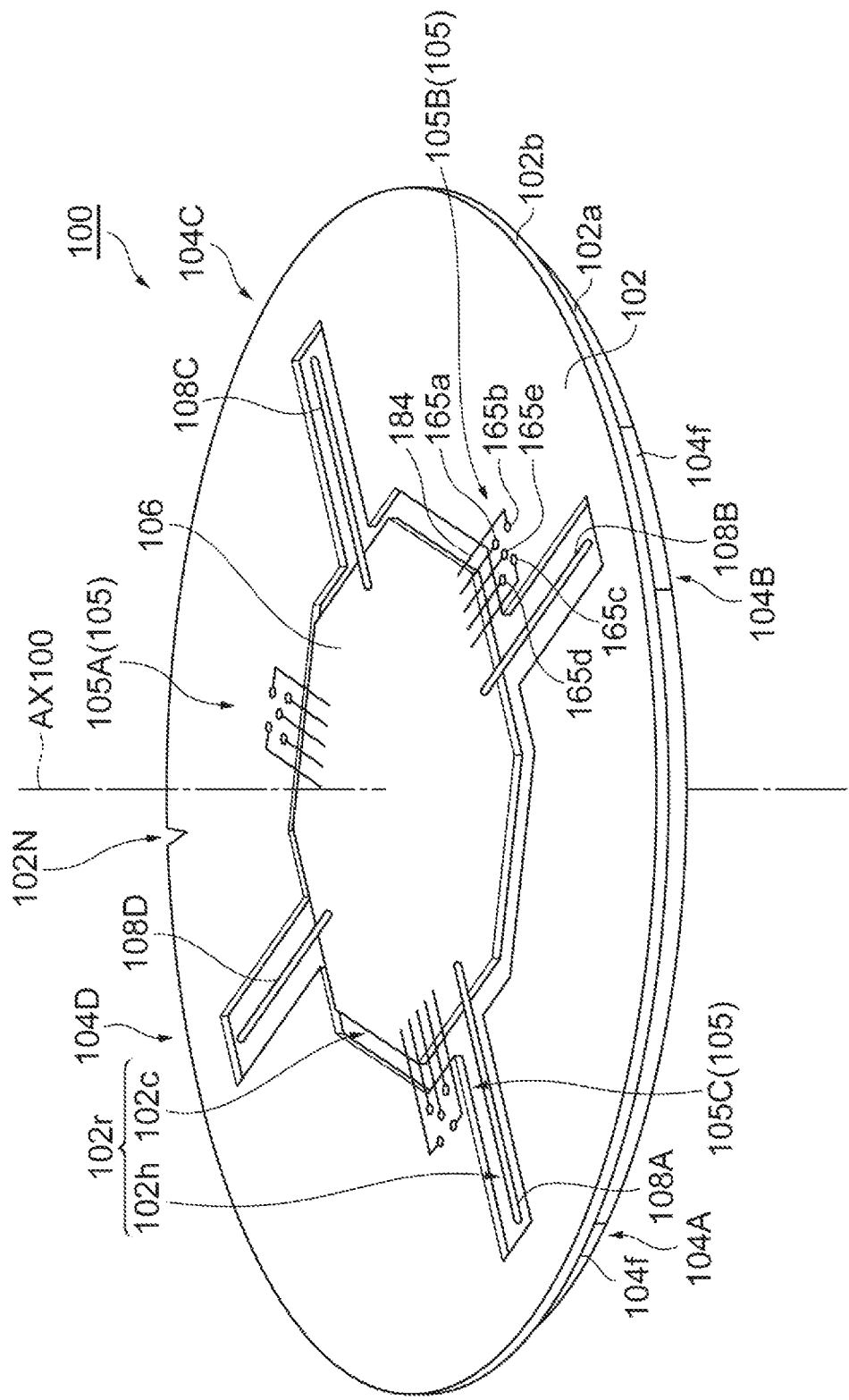
FIG. 5 is a perspective view illustrating an exemplary measuring instrument.
Figure 6:
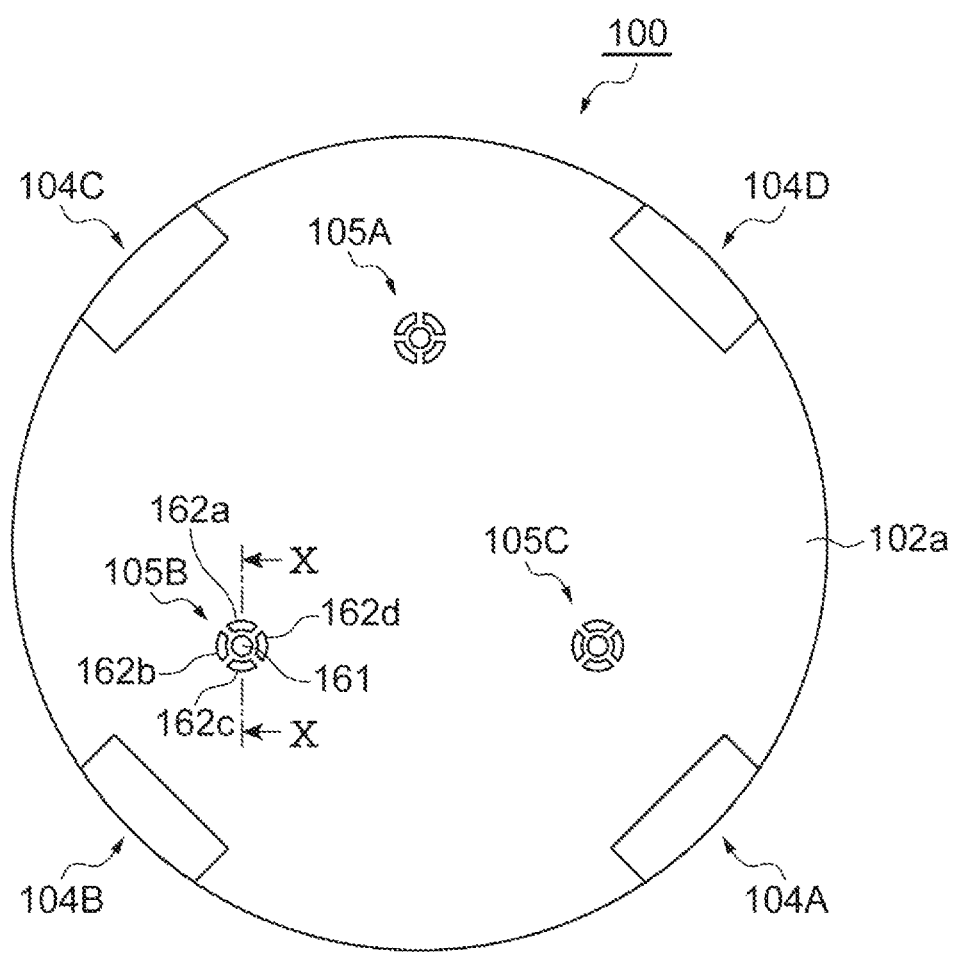
FIG. 6 illustrates a plan view of the measuring instrument illustrated in FIG. 5 viewed from a bottom surface side.

Hereinafter, a measuring instrument will be described. FIG. 5 is a perspective view illustrating an exemplary measuring instrument. FIG. 6 illustrates a plan view of the measuring instrument illustrated in FIG. 5 viewed from a bottom surface side. A measuring instrument 100 illustrated in FIGS. 5 and 6 includes a base substrate 102. For example, the base substrate 102 is formed of silicon and has a shape same as that of the workpiece W, that is, a substantial disk shape. The diameter of the base substrate 102 is a diameter same as that of the workpiece W, for example, 300 mm. The shape and the size of the measuring instrument 100 are defined by the shape and the size of the base substrate 102. Therefore, the measuring instrument 100 has the shape same as that of the workpiece W, and has the size same as that of the workpiece W. In addition, a notch 102N (or different type of marker) is formed at the edge of the base substrate 102.

The base substrate 102 has a lower portion 102a and an upper portion 102b. The lower portion 102a is a portion positioned closer to the electrostatic chuck ESC than the upper portion 102b when the measuring instrument 100 is disposed on the electrostatic chuck ESC. A plurality of first sensors 104A to 104D for measuring electrostatic capacities are provided in the lower portion 102a of the base substrate 102. The number of first sensors provided in the measuring instrument 100 can be an arbitrary number of three or more. The plurality of first sensors 104A to 104D are arranged along the edge of the base substrate 102, for example, at equal distances in the whole circumference of the edge. Specifically, a front side end surface 104f of each of the plurality of first sensors 104A to 104D is provided along the edge of the lower portion 102a of the base substrate 102.

The top surface of the upper portion 102b of the base substrate 102 provides a recessed portion 102r. The recessed portion 102r includes a central region 102c and a plurality of radiation regions 102h. The central region 102c is a region intersecting a central axis AX100. The central axis AX100 is an axis passing through the center of the base substrate 102 in the plate-thickness direction. A circuit board 106 is provided in the central region 102c. The plurality of radiation regions 102h extend in radiation directions with respect to the central axis AX100 from the central region 102c to a location above the regions where the plurality of first sensors 104A to 104D are respectively disposed. Wiring groups 108A to 108D are provided in the plurality of radiation regions 102h, respectively. The wiring groups 108A to 108D electrically connect the plurality of first sensors 104A to 104D with the circuit board 106, respectively. It should be noted that the plurality of first sensors 104A to 104D may be provided in the upper portion 102b of the base substrate 102.

In addition, a plurality of second sensors 105A to 105C for measuring electrostatic capacities are provided in the base substrate 102. The number of second sensors provided in the measuring instrument 100 can be an arbitrary number of one or more. In one embodiment, three second sensors 105A to 105C are disposed along a circle sharing the central axis AX100 of the base substrate 102 at equal distances in the circumferential direction. The distance between an after-mentioned bottom electrode of each of the second sensors 105A to 105C and the central axis AX100 can substantially coincide with the distance between the central axis of the placement stage PD and each of the lift pins 25a.

Figure 7:
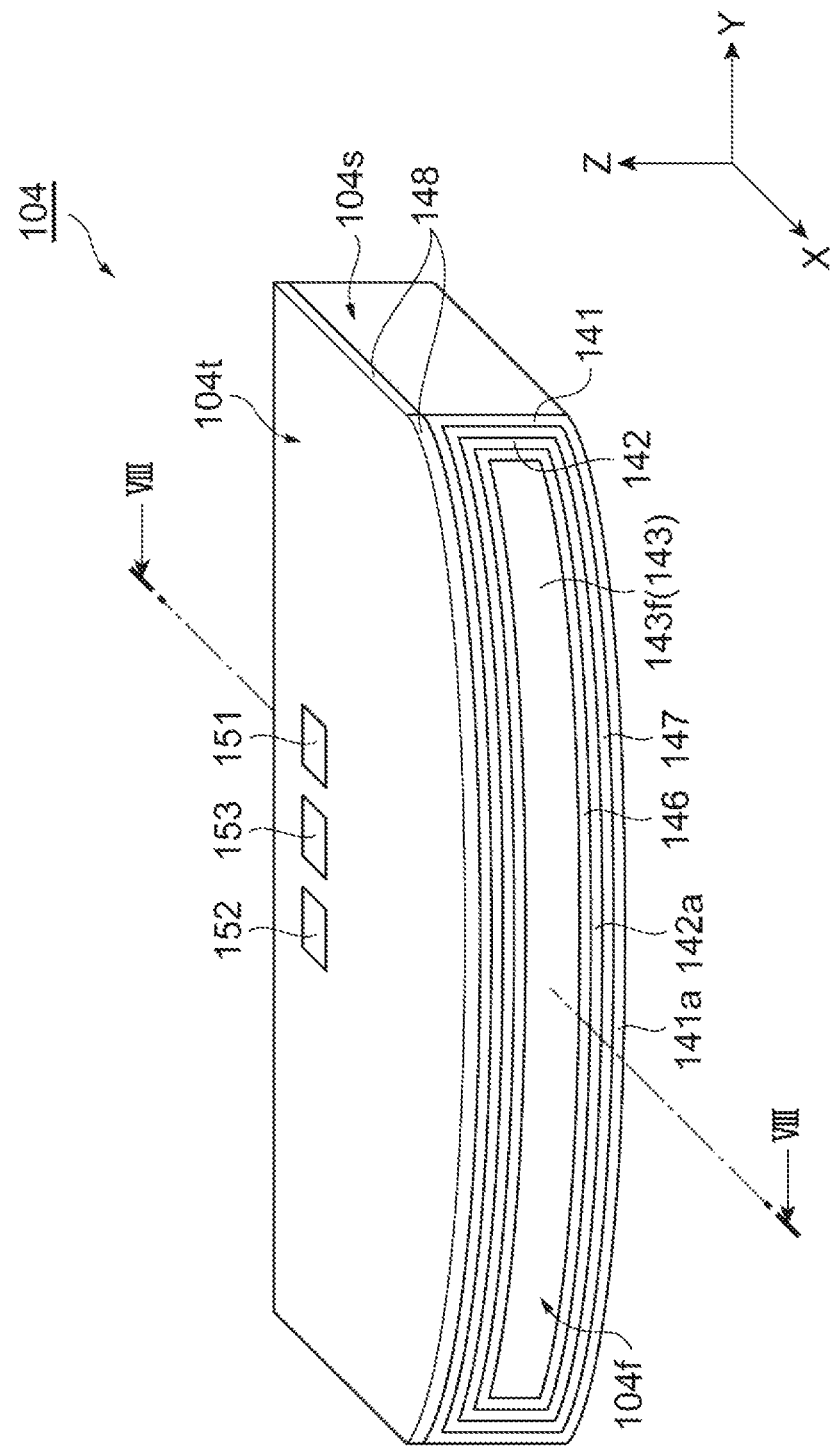
FIG. 7 is a perspective view illustrating an example of a first sensor.
Figure 8:
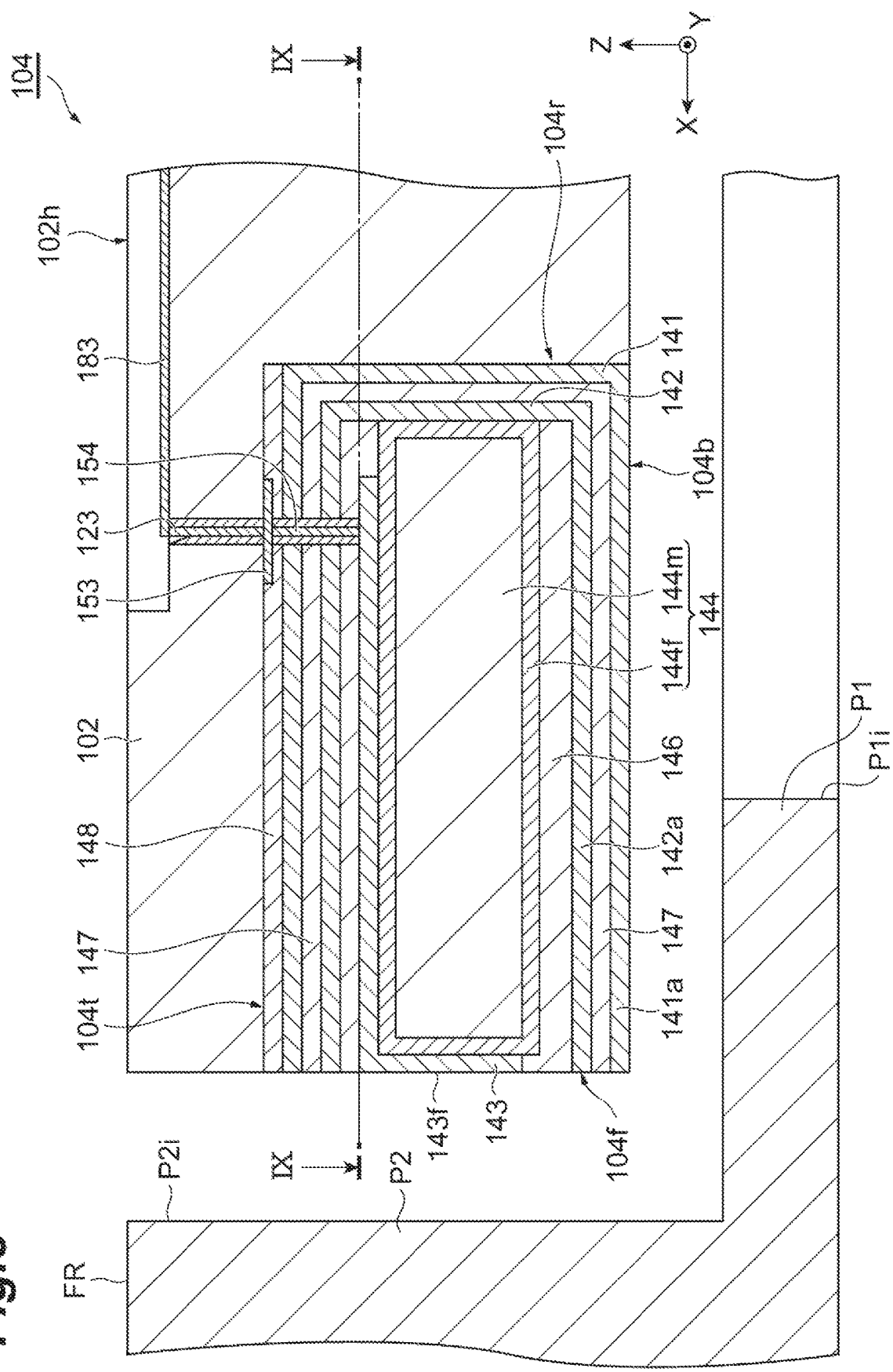
FIG. 8 is a cross-sectional view taken along line in FIG. 7.
Figure 9:
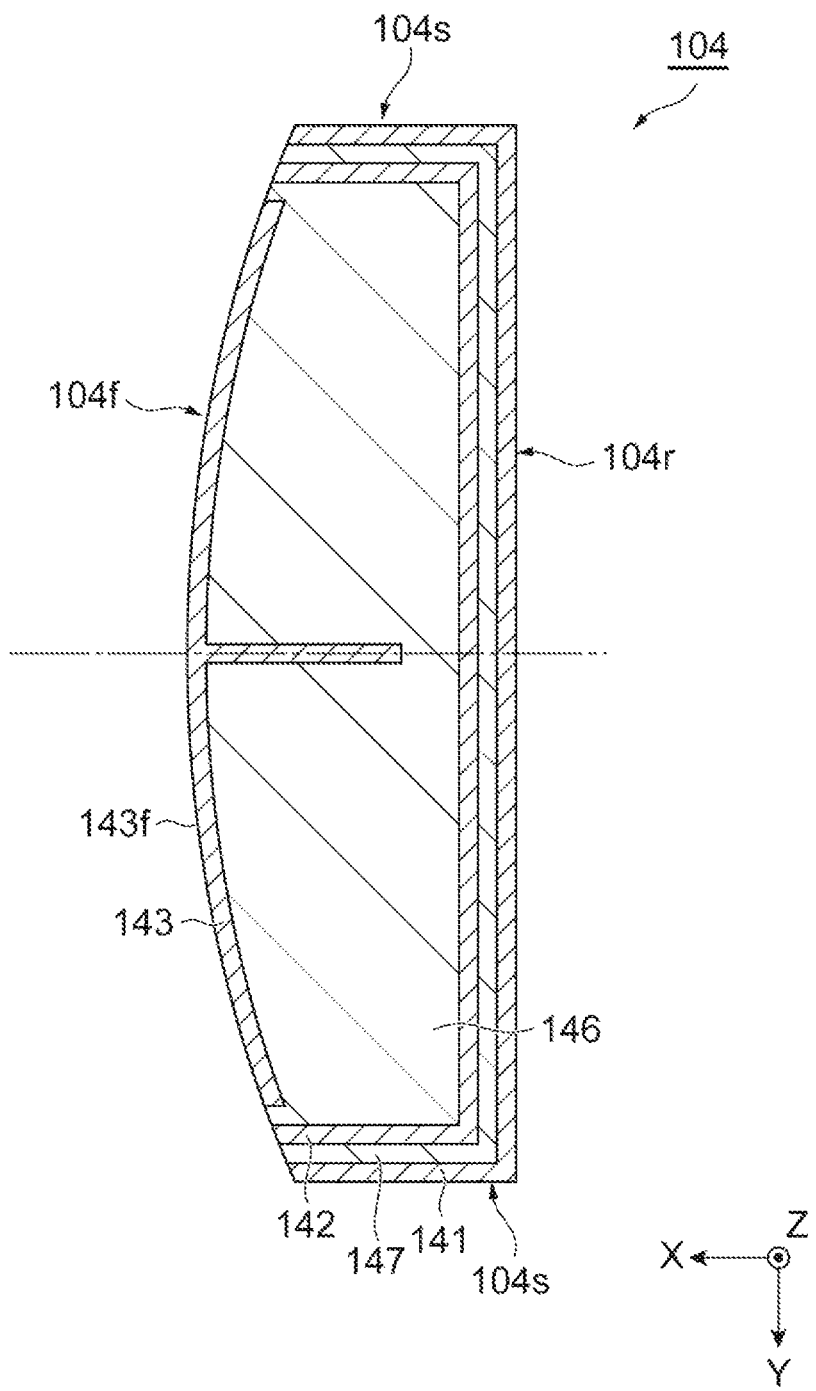
FIG. 9 is a cross-sectional view taken along line IX-IX in FIG. 8.

Hereinafter, the first sensor will be described in detail. FIG. 7 is a perspective view illustrating an example of the sensor. FIG. 8 is a cross-sectional view taken along line VIII-VIII in FIG. 7 and illustrates the base substrate and the focus ring of the measuring instrument together with the sensor. FIG. 9 is a cross-sectional view taken along line IX-IX in FIG. 8. The first sensor 104 illustrated in FIGS. 7 to 9 is a sensor utilized as the plurality of first sensors 104A to 104D of the measuring instrument 100 and is configured as a chip component in an example. In the description below, an XYZ orthogonal coordinate system will be adopted as a reference, as necessary. An X-direction indicates the forward direction of the first sensor 104. A Y-direction indicates a direction orthogonal to the X-direction, that is, the width direction of the first sensor 104. A Z-direction indicates a direction orthogonal to the X-direction and the Y-direction, that is, the upward direction of the first sensor 104.

As illustrated in FIGS. 7 to 9, the first sensor 104 has the front side end surface 104*f*, a top surface 104*t*, a lower surface 104*b*, a pair of side surfaces 104*s*, and a rear side end surface 104*r*. The front side end surface 104*f* configures a front side outer surface of the first sensor 104 in the X-direction. The first sensor 104 is mounted in the base substrate 102 of the measuring instrument 100 such that the front side end surface 104*f* is oriented in the radiation direction with respect to the central axis AX100 (refer to FIG. 5). In addition, in a state where the first sensor 104 is mounted in the base substrate 102, the front side end surface 104*f* extends along the edge of the base substrate 102. Therefore, in a state where the measuring instrument 100 is disposed on the electrostatic chuck ESC, the front side end surface 104*f* faces the inner edge of the focus ring FR.

The rear side end surface 104*r* configures a rear side outer surface of the first sensor 104 in the X-direction. In a state where the first sensor 104 is mounted in the base substrate 102, the rear side end surface 104*r* is positioned closer to the central axis AX100 than the front side end surface 104*f*. The top surface 104*t* configures an upper side outer surface of the first sensor 104 in the Z-direction. The lower surface 104*b* configures a lower side outer surface of the first sensor 104 in the Z-direction. In addition, the pair of side surfaces 104*s* configures outer surfaces of the first sensor 104 in the Y-direction.

The first sensor 104 has an electrode (i.e. side electrode) 143. The first sensor 104 may further include an electrode 141 and an electrode 142. The electrode 141 is formed with a conductor. The electrode 141 has a first portion 141*a*. As illustrated in FIGS. 7 and 8, the first portion 141*a* extends in the X-direction and the Y-direction.

The electrode 142 is formed with a conductor. The electrode 142 has a second portion 142*a*. The second portion 142*a* extends above the first portion 141*a*. In the first sensor 104, the electrode 142 is isolated from the electrode 141. As illustrated in FIGS. 7 and 8, the second portion 142*a* extends in the X-direction and the Y-direction above the first portion 141*a*.

The electrode 143 is a sensor electrode formed with a conductor. The electrode 143 is provided above the first portion 141*a* of the electrode 141 and the second portion 142*a* of the electrode 142. In the first sensor 104, the electrode 143 is isolated from the electrode 141 and the electrode 142. The electrode 143 has a front surface 143*f*. The front surface 143*f* extends in a direction intersecting the first portion 141*a* and the second portion 142*a*. In addition, the front surface 143*f* extends along the front side end surface 104*f* of the first sensor 104. In one embodiment, the front surface 143*f* configures a portion of the front side end surface 104*f* of the first sensor 104. Alternatively, the first sensor 104 may have an insulating film on the front side of the front surface 143*f* of the electrode 143 so as to cover the front surface 143*f*.

As illustrated in FIGS. 7 to 9, the electrode 141 and the electrode 142 may be open on a side of the region where the front surface 143*f* of the electrode 143 is disposed (X-direction) and may extend so as to surround the electrode 143. That is, the electrode 141 and the electrode 142 may extend above, behind, and beside the electrode 143 so as to surround the electrode 143.

In addition, the front side end surface 104*f* of the first sensor 104 can be a curved surface having a predetermined curvature. In this case, the front side end surface 104*f* has a uniform curvature at an arbitrary position on the front side end surface. The curvature of the front side end surface 104*f* can be an inverse number of the distance between the central axis AX100 of the measuring instrument 100 and the front side end surface 104*f*. The first sensor 104 is mounted in the base substrate 102 such that the curvature center of the front side end surface 104*f* coincides with the central axis AX100.

In addition, the first sensor 104 can further include a substrate portion 144, insulating regions 146 to 148, pads 151 to 153, and a via wiring 154. The substrate portion 144 has a main body portion 144*m* and an outer layer portion 144*f*. For example, the main body portion 144*m* is formed of silicon. The outer layer portion 144*f* covers the outer surface of the main body portion 144*m*. The outer layer portion 144*f* is formed of an insulating material. For example, the outer layer portion 144*f* is a thermal silicon oxide film.

The second portion 142*a* of the electrode 142 extends below the substrate portion 144. The insulation region 146 is provided between the substrate portion 144 and the electrode 142. For example, the insulation region 146 is formed of $SiO_2$, $SiN$, $Al_2O_3$, or polyimide.

The first portion 141*a* of the electrode 141 extends below the substrate portion 144 and the second portion 142*a* of the electrode 142. The insulation region 147 is provided between the electrode 141 and the electrode 142. For example, the insulation region 147 is formed of $SiO_2$, $SiN$, $Al_2O_3$, or polyimide.

The insulation region 148 configures the top surface 104*t* of the first sensor 104. For example, the insulation region 148 is formed of $SiO_2$, $SiN$, $Al_2O_3$, or polyimide. The pads 151 to 153 are formed in the insulation region 148. The pad 153 is formed with a conductor and is connected to the electrode 143. Specifically, the electrode 143 and the pad 153 are connected to each other through the via wiring 154 penetrating the insulation region 146, the electrode 142, the insulation region 147, and the electrode 141. An insulator is provided around the via wiring 154, and the via wiring 154 is isolated from the electrode 141 and the electrode 142. The pad 153 is connected to the circuit board 106 via a via wiring 123 provided in the base substrate 102, and a wiring 183 provided in the radiation region 102*h* of the recessed portion 102*r*. Similarly, the pad 151 and the pad 152 are formed with conductors. The pad 151 and the pad 152 are connected to the electrode 141 and the electrode 142 via the via wirings, respectively. In addition, the pad 151 and the pad 152 are connected to the circuit board 106 via the respective wirings provided in the base substrate 102 and the respective wiring provided in the radiation region 102*h* of the recess portion 102*r*.

Figure 10:
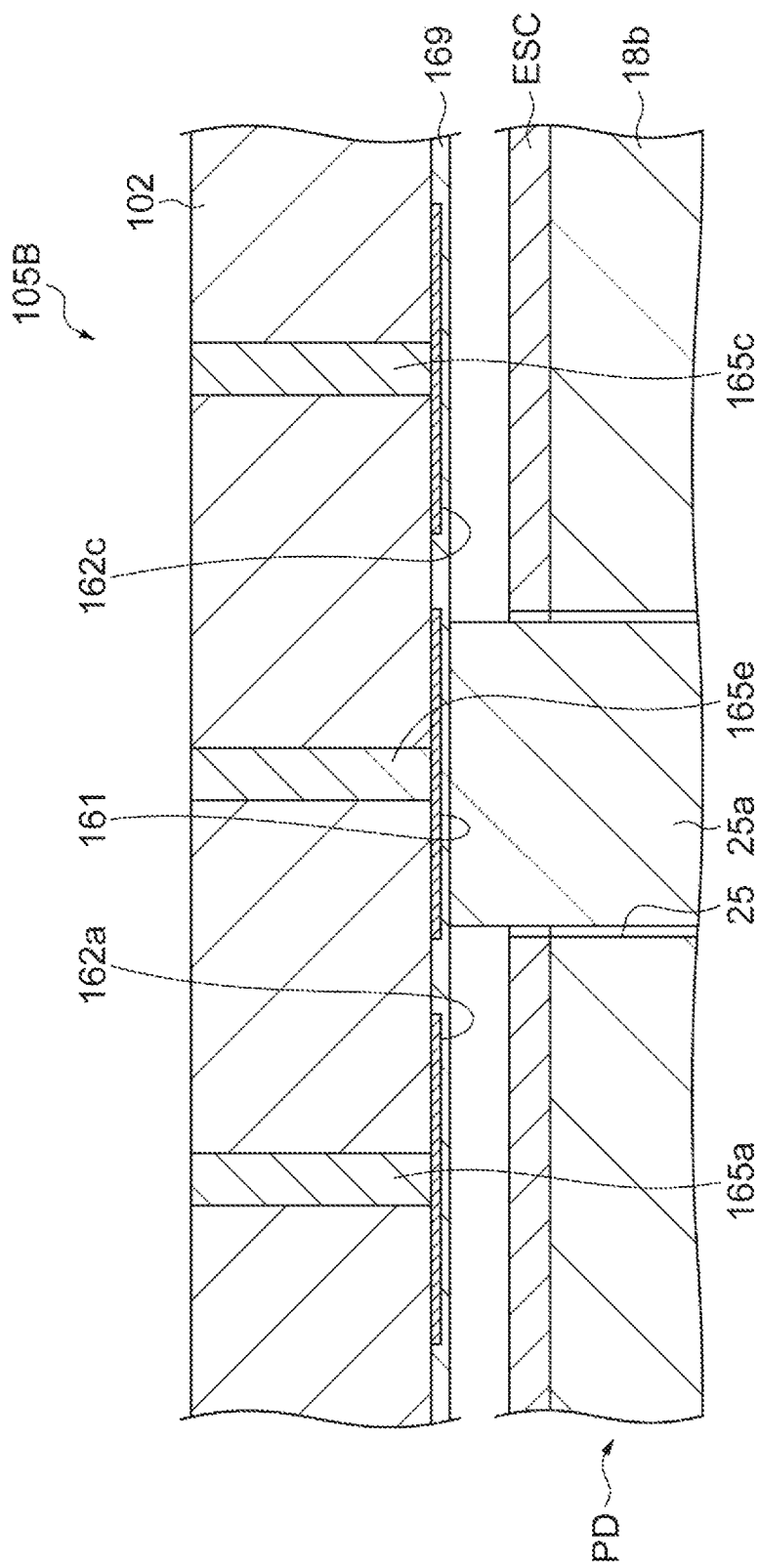
FIG. 10 is a cross-sectional view taken along line X-X in FIG. 6.

Hereinafter, the second sensors will be described in detail. FIG. 10 is a cross-sectional view taken along line X-X in FIG. 6. FIG. 10 illustrates a state where the measuring instrument 100 is supported by the lift pins 25*a*. Hereinafter, FIGS. 5, 6, and 10 will be referred to. Each of the second sensors 105A to 105C includes a bottom electrode 161. In one embodiment, each of the second sensors 105A to 105C may further include peripheral electrodes 162*a* to 162*d* and through electrodes 165*a* to 165*e*. The bottom electrode 161 and the peripheral electrodes 162*a* to 162*d* are formed along the bottom surface of the base substrate 102. The through electrodes 165a to 165e penetrate the base substrate 102. The bottom electrode 161, the peripheral electrodes 162a to 162d, and the through electrodes 165a to 165e are formed with conductors.

The bottom electrode 161 can have a circle shape. For example, the size of the bottom electrode 161 is substantially the same as the size of the upper end surface of the lift pin 25a. The peripheral electrodes 162a to 162d are arranged on a circle surrounding the bottom electrode 161. Each of the peripheral electrodes 162a to 162d has a planar shape which is defined by two arcs sharing the center of the bottom electrode 161 and having radii different from each other. In addition, the peripheral electrodes 162a to 162d are arranged in the circumferential direction with respect to the center of the bottom electrode 161. An insulating film 169 is formed on the bottom surface of the base substrate 102. The insulating film 169 covers the bottom electrode 161 and the peripheral electrodes 162a to 162d. For example, the insulating film 169 is formed of $SiO_2$, SiN, $Al_2O_3$, or polyimide.

One ends of the plurality of through electrodes 165a to 165e are connected to the peripheral electrodes 162a to 162d and the bottom electrode 161, respectively. In addition, the respective other ends of the plurality of through electrodes 165a to 165e are electrically connected to the circuit board 106 (refer to FIG. 5). For example, the plurality of through electrodes 165a to 165e can be formed by using a through-silicon via (TSV) technology.

Figure 11:
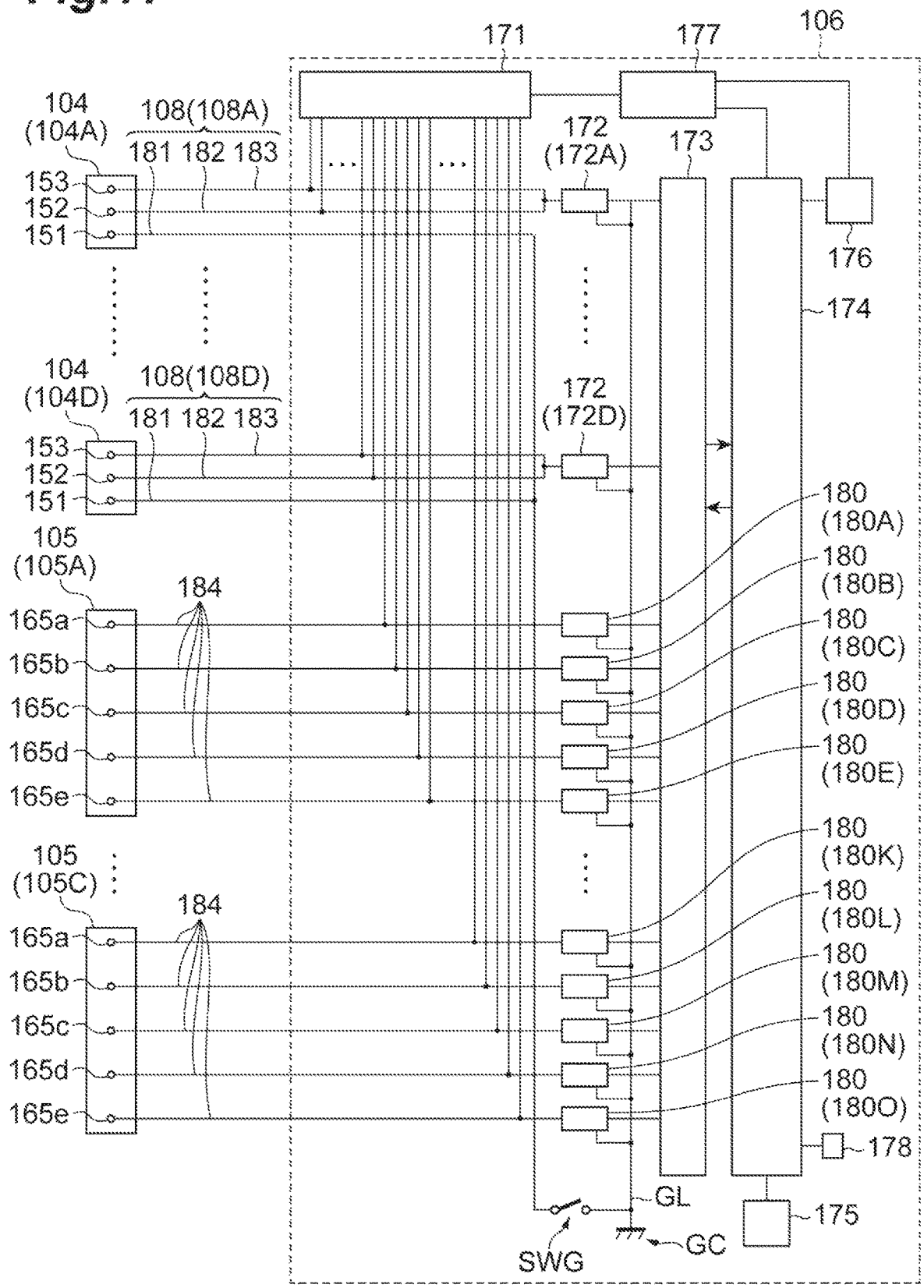
FIG. 11 is a view illustrating a configuration of a circuit board of an exemplary measuring instrument.

Hereinafter, the configuration of the circuit board 106 will be described. FIG. 11 is a view illustrating a configuration of a circuit board of an exemplary measuring instrument. As illustrated in FIG. 11, the circuit board 106 has a high frequency oscillator 171, a plurality of C/V conversion circuits 172A to 172D, a plurality of C/V conversion circuits 180A to 180O, an A/D converter 173, a processor 174, a storage device 175, a communication device 176, and a power source 177.

Each of the plurality of first sensors 104A to 104D is connected to the circuit board 106 via the corresponding wiring group among a plurality of wiring groups 108A to 108D. In addition, each of the plurality of first sensors 104A to 104D is connected to the corresponding C/V conversion circuit among the plurality of C/V conversion circuits 172A to 172D via several wirings included in the corresponding wiring group. In addition, each of the plurality of second sensors 105A to 105C is connected to the corresponding C/V conversion circuits (in the embodiment, five C/V conversion circuits) among the plurality of C/V conversion circuits 180A to 180O via a plurality of wirings 184. Hereinafter, description will be given regarding one first sensor 104 having the same configuration as that of each of the plurality of first sensors 104A to 104D, one wiring group 108 having the same configuration as that of each of the plurality of wiring groups 108A to 108D, one C/V conversion circuit 172 having the same configuration as that of each of the plurality of C/V conversion circuits 172A to 172D, one second sensor 105 having the same configuration as that of each of the plurality of second sensors 105A to 105C, and one C/V conversion circuit 180 having the same configuration as that of each of the plurality of C/V conversion circuits 180A to 180O.

The wiring group 108 includes wirings 181 to 183. One end of the wiring 181 is connected to the pad 151 which is connected to the electrode 141. The wiring 181 is connected to a ground potential line GL which is connected to ground GC of the circuit board 106. The wiring 181 may be connected to the ground potential line GL via a switch SWG.

In addition, one end of the wiring 182 is connected to the pad 152 which is connected to the electrode 142, and the other end of the wiring 182 is connected to the C/V conversion circuit 172. In addition, one end of the wiring 183 is connected to the pad 153 which is connected to the electrode 143, and the other end of the wiring 183 is connected to the C/V conversion circuit 172.

The peripheral electrodes 162a to 162d and the bottom electrode 161 of the second sensor 105 are individually connected to the circuit board 106. That is, the through electrodes 165a to 165d respectively connected to the peripheral electrodes 162a to 162d, and the through electrode 165e connected to the bottom electrode 161 are connected to the plurality of C/V conversion circuits 180 (in the embodiment, five C/V conversion circuits) via the individual wirings 184, respectively.

The high frequency oscillator 171 is connected to the power source 177 such as a battery and is configured to receive electric power from the power source 177 to generate a high frequency signal. The power source 177 is also connected to the processor 174, the storage device 175, and the communication device 176. The high frequency oscillator 171 has a plurality of output lines. The high frequency oscillator 171 applies the generated high frequency signal to the wiring 182, the wiring 183, and the wirings 184 via the plurality of output lines. Therefore, the high frequency oscillator 171 is electrically connected to the electrode 142 and the electrode 143 of the first sensor 104, and the high frequency signal from the high frequency oscillator 171 is applied to the electrode 142 and the electrode 143. In addition, the high frequency oscillator 171 is electrically connected to the bottom electrode 161 and the peripheral electrodes 162a to 162d of the second sensor 105, and the high frequency signal from the high frequency oscillator 171 is applied to the bottom electrode 161 and the peripheral electrodes 162a to 162d.

The wiring 182 and the wiring 183 are connected to an input of the C/V conversion circuit 172. That is, the electrode 142 and the electrode 143 of the first sensor 104 are connected to the input of the C/V conversion circuit 172. In addition, the bottom electrode 161 and the peripheral electrodes 162a to 162d are connected to the inputs of the plurality of C/V conversion circuits 180, respectively. Each of the C/V conversion circuit 172 and the C/V conversion circuits 180 generates a voltage signal based on a voltage amplitude in the input thereof. The voltage signal indicates an electrostatic capacity of the electrode connected to the input. Each of the C/V conversion circuit 172 and the C/V conversion circuits 180 outputs the voltage signal. As the electrostatic capacity of the electrode connected to the C/V conversion circuit 172 becomes greater, the magnitude of the voltage of the voltage signal output by the C/V conversion circuit 172 increases. Similarly, as the electrostatic capacity of the electrode connected to the C/V conversion circuit 180 becomes greater, the magnitude of the voltage of the voltage signal output by the C/V conversion circuit 180 increases.

Outputs of the plurality of C/V conversion circuits 172A to 172D and the plurality of C/V conversion circuits 180A to 180O are connected to an input of the A/D converter 173. In addition, the A/D converter 173 is connected to the processor 174. The A/D converter 173 is controlled based on a control signal from the processor 174 and converts output signals (voltage signals) of the plurality of C/V conversion circuits 172A to 172D and output signals (voltage signals) of the plurality of C/V conversion circuits 180A to 180O into digital values. That is, the A/D converter 173 generates a first measurement value indicating the electrostatic capacity of the electrode 143 of each of the first sensors 104A to 104D. In addition, the A/D converter 173 generates a second measurement value indicating the electrostatic capacity of the bottom electrode 161 of each of the second sensors 105A to 105C and generates a plurality of third measurement values indicating the respective electrostatic capacities of the peripheral electrodes 162a to 162d of each of the second sensors 105A to 105C. The A/D converter 173 outputs the first measurement value, the second measurement value, and the third measurement values to the processor 174.

The storage device 175 is connected to the processor 174. The storage device 175 is a storage device such as a volatile memory and is configured to store measurement data, which will be described later. In addition, another storage device 178 is connected to the processor 174. The storage device 178 is a storage device such as a non-volatile memory and stores a program which is read and executed by the processor 174.

The communication device 176 is one that is compliant with an arbitrary wireless communication standard. For example, the communication device 176 is compliant with Bluetooth (registered trademark). The communication device 176 is configured to wirelessly transmit the measurement data stored in the storage device 175.

The processor 174 is configured to control each part of the measuring instrument 100 by executing the above-described program. For example, the processor 174 controls supply of the high frequency signal from the high frequency oscillator 171 with respect to the electrode 142, the electrode 143, the bottom electrode 161, and the peripheral electrodes 162a to 162d; supply of electric power from the power source 177 with respect to the storage device 175; supply of electric power from the power source 177 with respect to the communication device 176; and the like. Moreover, the processor 174 executes the above-described program, thereby executing acquiring of the first to third measurement values, storing of the first to third measurement values in the storage device 175, transmitting of the first to third measurement values, and the like.

In the measuring instrument 100 described above, the plurality of electrodes 143 (i.e. side electrodes) provided by the first sensors 104A to 104D are arranged along the edge of the base substrate 102. In a state where the measuring instrument 100 is disposed in a region surrounded by the focus ring FR, the plurality of electrodes 143 face the inner edge of the focus ring FR. A plurality of the first measurement values generated based on the voltage amplitudes in the electrodes 143 indicate the electrostatic capacities reflecting the distances from the plurality of electrodes 143 to the focus ring. An electrostatic capacity C is expressed through C=εS/d. The factor ε is a dielectric constant of a medium between the front surface 143f of the electrode 143 and the inner edge of the focus ring FR. The factor S indicates the area of the front surface 143f of the electrode 143. The factor d can be regarded as the distance between the front surface 143f of the electrode 143 and the inner edge of the focus ring FR. Therefore, according to the measuring instrument 100, the measurement data reflecting a relative positional relationship between the measuring instrument 100 copying the workpiece W, and the focus ring FR can be obtained. For example, the plurality of first measurement values acquired by the measuring instrument 100 become smaller as the distances between the front surfaces 143f of the electrodes 143 and the inner edge of the focus ring FR increases.

In addition, in the measuring instrument 100, the bottom electrode 161 of each of the second sensors 105A to 105C is disposed along the bottom surface of the base substrate 102. The second measurement value generated based on the voltage amplitude in the bottom electrode 161 indicates the electrostatic capacity between the bottom electrode 161 and a substance below the measuring instrument 100. That is, the second measurement value reflects the relative positional relationship between the bottom electrode 161 and the substance below the measuring instrument 100. In one embodiment, the second measurement value reflects the relative positional relationship between the bottom electrode 161 and the lift pin 25a which is the substance below the measuring instrument 100. Specifically, the second measurement value becomes greater when the bottom electrode 161 and the tip end of the lift pin 25a face each other. Meanwhile, the second measurement value becomes smaller in a case where the position of the bottom electrode 161 deviates from the tip end position of the lift pin 25a. As described above, the positional relationship between the bottom electrode 161 of each of the second sensors 105A to 105C and the central axis AX100 of the measuring instrument 100 substantially coincides with the positional relationship between each of the lift pins 25a and the central axis of the placement stage PD. Therefore, in a case where the second measurement value is a value equal to or greater than a predetermined value, it is possible to check that when the lift pins 25a is moved down, the measuring instrument 100 is disposed in the region surrounded by the focus ring FR. Therefore, according to the second measurement value, it is possible to check whether or not the measuring instrument 100 is disposed on the placement stage PD within the region surrounded by the focus ring FR. It is possible to confirm the reliability of the above-described first measurement values by using the second measurement value. Therefore, according to the measuring instrument 100, it is possible to acquire highly reliable data reflecting the positional relationship between the measuring instrument 100 copying the workpiece W, and the focus ring FR.

In addition, the peripheral electrodes 162a to 162d are provided in each of the second sensors 105A to 105C so as to surround the bottom electrode 161. When the plurality of third measurement values which can be obtained based on the voltage amplitudes in the peripheral electrodes 162a to 162d are used together with the second measurement value, it is possible to more exactly check whether or not the measuring instrument 100 is disposed on the placement stage PD within the region surrounded by the focus ring FR.

In addition, as described above, in the first sensor 104 mounted in the measuring instrument 100, the electrode 143 (sensor electrode) is provided on the electrode 141, and a second portion of the electrode 142 is interposed between the electrode 141 and the electrode 143. When the first sensor 104 is utilized, the switch SWG is closed and the potential of the electrode 141 is set to the ground potential. The high frequency signal is then supplied to the electrode 142 and the electrode 143. In this case, the voltage amplitude of the electrode 143 is not influenced by the electrostatic capacity in a direction in which the electrode 141 is provided with respect to the electrode 143, that is, from below the first sensor 104. The voltage amplitude of the electrode 143 becomes a voltage amplitude reflecting the electrostatic capacity in a particular direction, that is, a direction in which the front surface 143f of the electrode 143 is oriented (X-direction). Therefore, according to the first sensor 104, the electrostatic capacity can be measured with high directivity in a particular direction.

In addition, the electrode 141 and the electrode 142 are open on the side of the region where the front surface of the electrode 143 is disposed (X-direction), and extend to surround the electrode 143. Therefore, by the electrode 141 and the electrode 142, the electrode 143 is shielded with respect to directions other than a particular direction. Therefore, in measuring the electrostatic capacity, directivity of the first sensor 104 with respect to a particular direction is further improved.

In addition, the front side end surface 104f of the first sensor 104 is configured as a curved surface having a predetermined curvature, and the front surface 143f of the electrode 143 extends along the front side end surface 104f. Therefore, the distance between each position of the front surface 143f of the electrode 143 and the inner edge of the focus ring FR in the radial direction can be set to a substantially equal distance. Therefore, the accuracy of measuring the electrostatic capacities is further improved.

Figure 12:
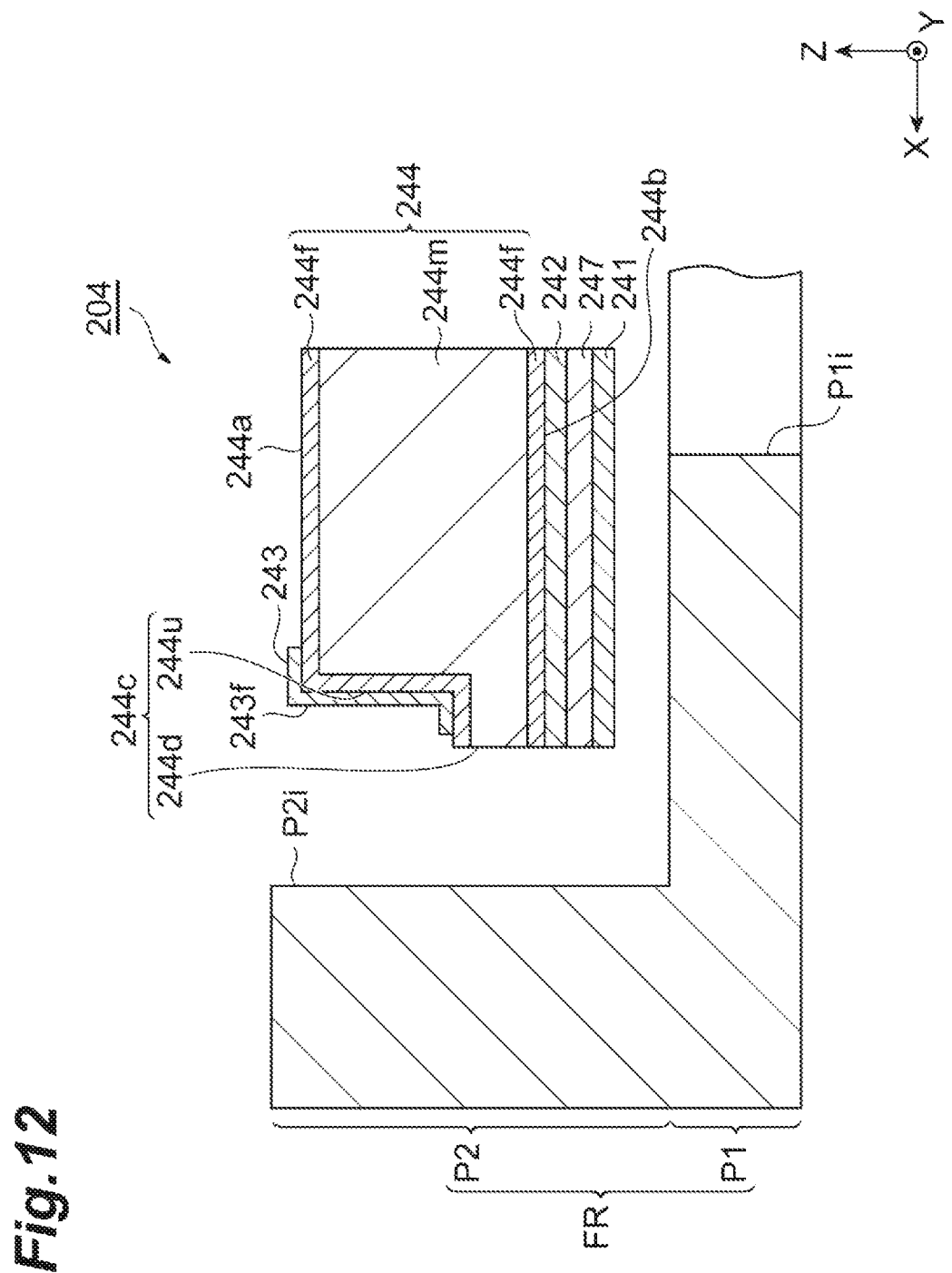
FIG. 12 is a longitudinal sectional view illustrating another example of the first sensor.

Hereinafter, another example of the first sensor which can be mounted in the measuring instrument 100 will be described. FIG. 12 is a longitudinal sectional view illustrating another example of the first sensor. FIG. 12 illustrates a longitudinal sectional view of a first sensor 204. In FIG. 12, the focus ring FR is illustrated together with the first sensor 204.

The first sensor 204 has an electrode 241, an electrode 242, and an electrode 243. The first sensor 204 can further include a substrate portion 244 and an insulation region 247. The substrate portion 244 has a main body portion 244m and an outer layer portion 244f. For example, the main body portion 244m is formed of silicon. The outer layer portion 244f covers the outer surface of the main body portion 244m. The outer layer portion 244f is formed of an insulating material. For example, the outer layer portion 244f is a thermal silicon oxide film.

The substrate portion 244 has a top surface 244a, a lower surface 244b, and a front side end surface 244c. The electrode 242 is provided below the lower surface 244b of the substrate portion 244 and extends in the X-direction and the Y-direction. In addition, the electrode 241 is provided below the electrode 242 via the insulating region 247 and extends in the X-direction and the Y-direction.

The front side end surface 244c of the substrate portion 244 is formed in a stepped shape. A lower portion 244d of the front side end surface 244c protrudes toward the focus ring FR side beyond an upper portion 244u of the front side end surface 244c. The electrode 243 extends along the upper portion 244u of the front side end surface 244c.

In a case where the first sensor 204 is used as the sensor of the measuring instrument 100, the electrode 241 is connected to the wiring 181, the electrode 242 is connected to the wiring 182, and the electrode 243 is connected to the wiring 183.

In the first sensor 204, the electrode 243 serving as the sensor electrode is shielded from the lower portion of the first sensor 204 by the electrode 241 and the electrode 242. Therefore, according to the first sensor 204, the electrostatic capacity can be measured with high directivity in a particular direction, that is, in a direction in which a front surface 243f of the electrode 243 is oriented (X-direction).

Figure 13A:
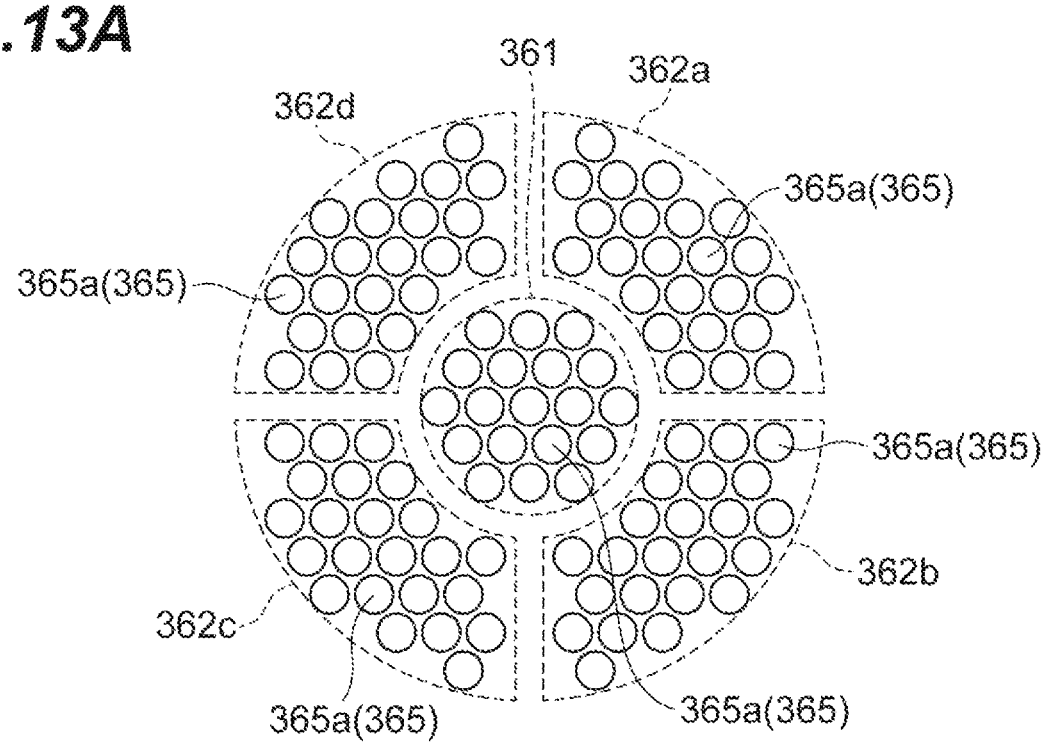
FIGS. 13A and 13B are a view illustrating another example of a second sensor.
Figure 13B:
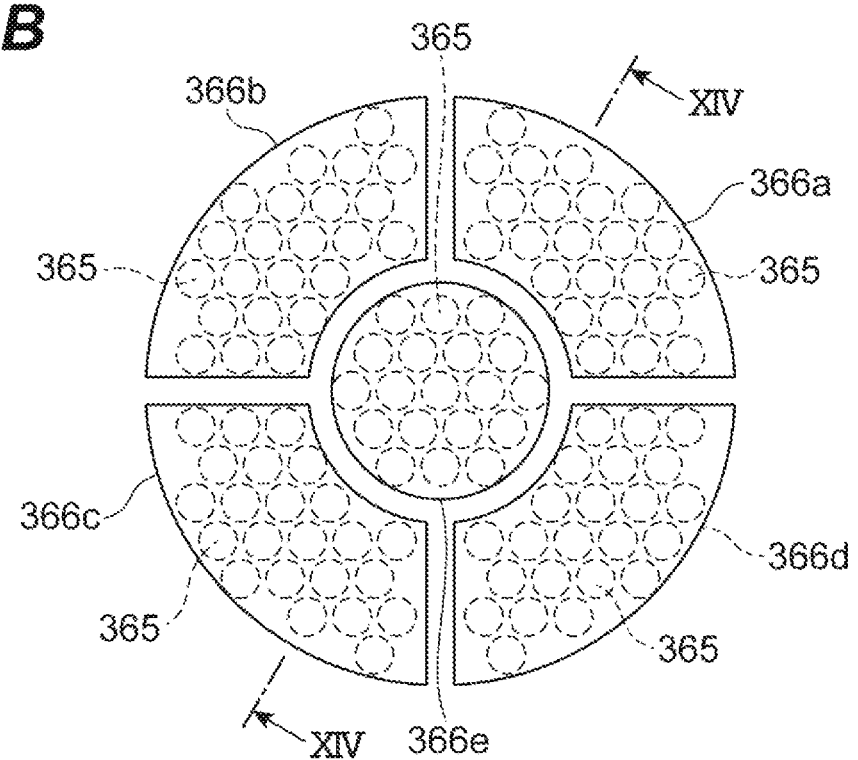
Figure 14:
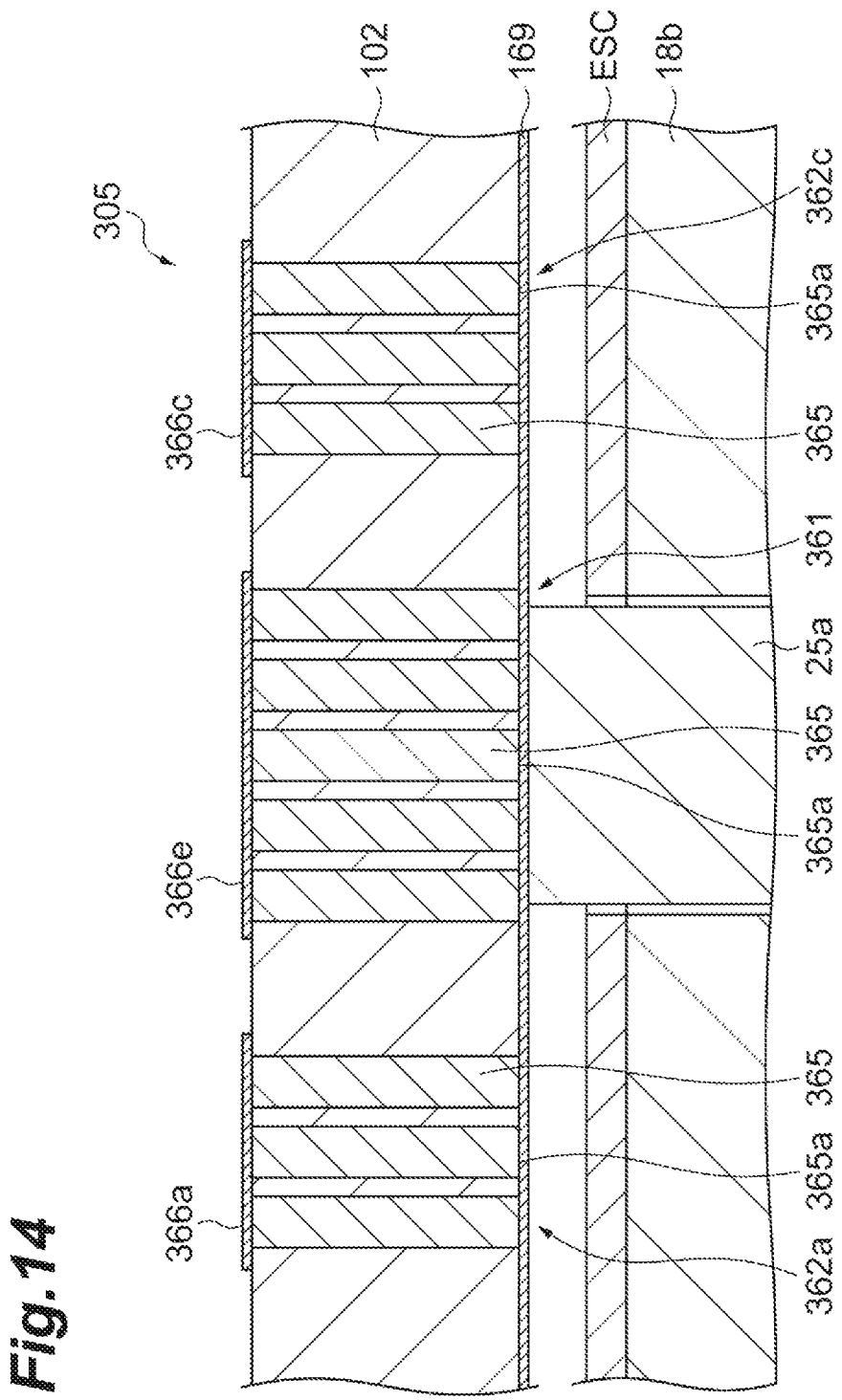
FIG. 14 is a cross-sectional view taken along line XIV-XIV in FIG. 13B.

Hereinafter, another example of the second sensor which can be mounted in the measuring instrument 100 in place of the second sensors 105A to 105C will be described. FIG. 13A is a plan view illustrating a plurality of electrodes of the second sensor of another example viewed from the bottom surface side of the measuring instrument. FIG. 13B is a plan view illustrating the second sensor viewed from the top surface side of the measuring instrument. In addition, FIG. 14 is a cross-sectional view taken along line XIV-XIV in FIG. 13B. FIG. 14 illustrates a state where the measuring instrument 100 is supported by the lift pins 25a.

A second sensor 305 includes a plurality of electrodes 365. The plurality of electrodes 365 are provided in the base substrate 102 so as to extend in the plate-thickness direction of the base substrate 102 from the top surface of the base substrate 102. In the second sensor 305, the plurality of electrodes 365 penetrates the base substrate 102. Each of the plurality of electrodes 365 provides an end surface 365a on the bottom surface side of the base substrate 102. The end surfaces 365a of the plurality of electrodes 365 configure the bottom electrode and the plurality of peripheral electrodes. Specifically, as illustrated in FIG. 13A, among the end surfaces 365a of the plurality of electrodes 365, several end surfaces 365a of the electrodes 365 present within a circular region 361 at the center configure the bottom electrode. In addition, several end surfaces 365a of the electrodes 365 present in the peripheral regions 362a to 362d surrounding the region 361 configure the peripheral electrodes. In the example illustrated in FIGS. 13A and 13B, the number of peripheral regions is four. Each of the peripheral regions 362a to 362d is defined by two arcs having radii different from each other and the peripheral regions 362a to 362d are arranged in the circumferential direction with respect to the center of the region 361. As illustrated in FIG. 14, the insulating film 169 is formed on the bottom surface of the base substrate 102. The insulating film 169 covers the end surface 365a of the plurality of electrodes 365.

On the top surface of the base substrate 102, pattern electrodes 366a to 366e are formed. The pattern electrodes 366a to 366e are opposite to the peripheral regions 362a to 362d and the region 361 and have substantially the same shapes as those of the peripheral regions 362a to 362d and the region 361. The electrodes 365 providing the end surfaces 365a in the peripheral region 362a are connected to the pattern electrode 366a. The electrodes 365 providing the end surfaces 365a in the peripheral region 362b are connected to the pattern electrode 366b. The electrodes 365 providing the end surfaces 365a in the peripheral region 362c are connected to the pattern electrode 366c. The electrodes 365 providing the end surfaces 365a in the peripheral region 362d are connected to the pattern electrode 366d. In addition, the electrodes 365 providing the end surfaces 365a in the region 361 are connected to the pattern electrode 366e. In preparing each of the above-described second sensors 105A to 105C, separately from the through electrodes 165a to 165e, a step of forming the bottom electrode and the peripheral electrodes is necessary. Meanwhile, in the second sensor 305, similar to the through electrodes 165a to 165e, the plurality of electrodes 365 extending in the plate-thickness direction of the base substrate 102 provide the bottom electrode and the peripheral electrodes. Therefore, in preparing the second sensor 305, the step of separately fruiting the bottom electrode and the peripheral electrodes is no longer necessary.

Figure 15:
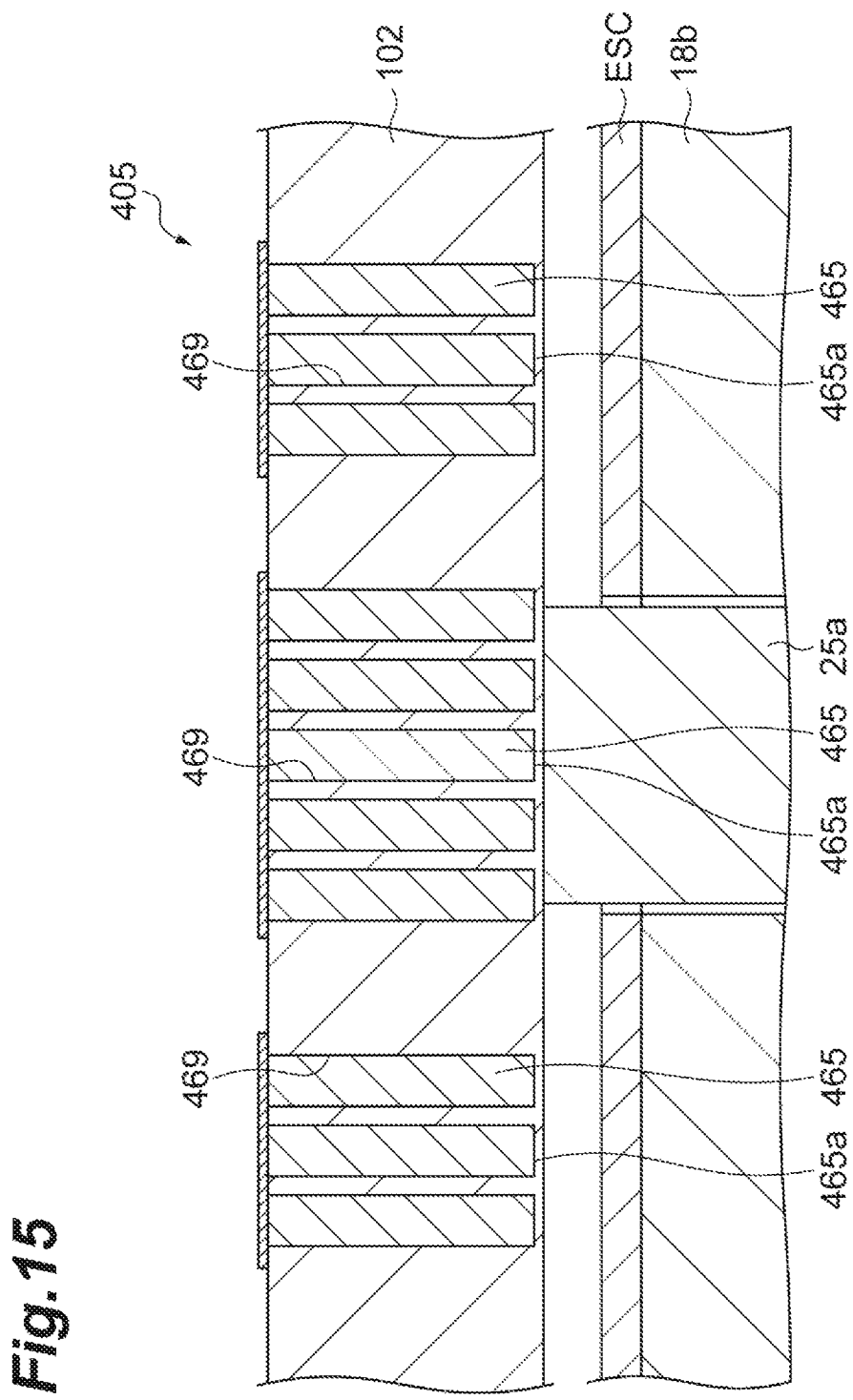
FIG. 15 is a view illustrating still another example of the second sensor.

Hereinafter, still another example of the second sensor which can be mounted in the measuring instrument 100 in place of the second sensors 105A to 105C will be described. FIG. 15 is a cross-sectional view illustrating still another example of the second sensor.

A second sensor 405 illustrated in FIG. 15 has a plurality of electrodes 465. The plurality of electrodes 465 are provided in the base substrate 102 so as to extend in the plate-thickness direction of the base substrate 102 from the top surface of the base substrate 102. In the second sensor 405, the plurality of electrodes 465 provide end surfaces 465a between the top surface and the bottom surface of the base substrate 102. Similar to the end surfaces 365a of the plurality of electrodes 365 of the second sensor 305, the end surfaces 465a of the plurality of electrodes 465 configure the bottom electrode and the plurality of peripheral electrodes. In the measuring instrument 100 in which the second sensor 405 is mounted, the base substrate 102 can be, for example, a glass substrate. In preparing the second sensor 405 as well, a step of separately forming the bottom electrode and the plurality of peripheral electrodes is no longer necessary.

Figure 16:
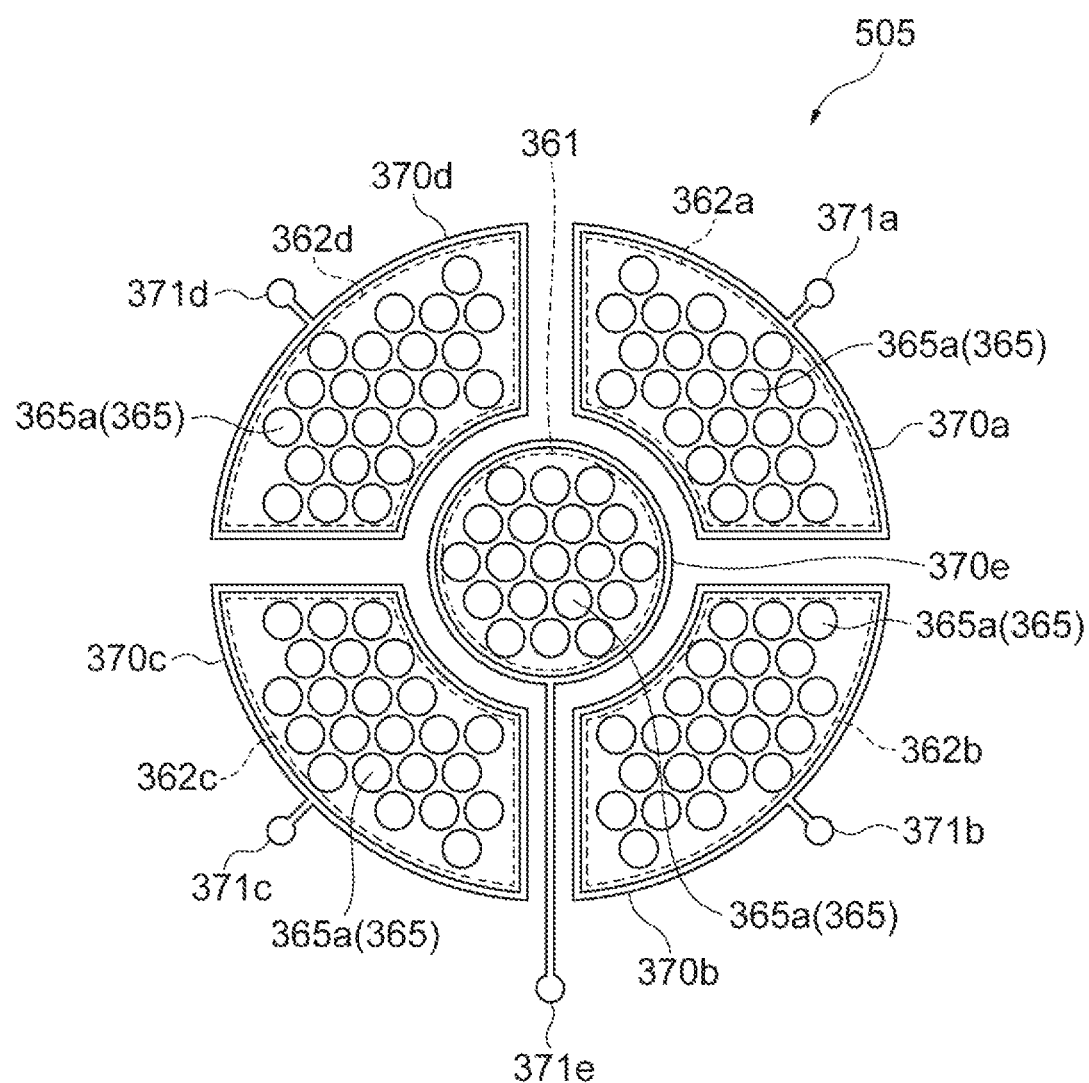
FIG. 16 is a view illustrating still another example of the second sensor.

Hereinafter, still another example of the second sensor which can be mounted in the measuring instrument 100 in place of the second sensors 105A to 105C will be described. FIG. 16 is a cross-sectional view illustrating still another example of the second sensor.

Similar to the second sensor 305, a second sensor 505 illustrated in FIG. 16 has the plurality of electrodes 365 disposed in each of the region 361 and the peripheral regions 362a to 362d. The second sensor 505 further includes surrounding electrodes 370a to 370e. The surrounding electrodes 370a to 370e are formed of conductors and are isolated from the electrodes 365 in the second sensor 505. The surrounding electrode 370a is formed along the bottom surface of the base substrate so as to collectively surround a group of the end surfaces 365a of the electrodes 365 disposed within the peripheral region 362a. A via electrode 371a penetrating the base substrate is connected to the surrounding electrode 370a. In addition, the surrounding electrode 370b is formed along the bottom surface of the base substrate so as to collectively surround the group of the end surfaces 365a of the electrodes 365 disposed within the peripheral region 362b. A via electrode 371b penetrating the base substrate is connected to the surrounding electrode 370b. In addition, the surrounding electrode 370c is formed along the bottom surface of the base substrate so as to collectively surround the group of the end surfaces 365a of the electrodes 365 disposed within the peripheral region 362c. A via electrode 371c penetrating the base substrate is connected to the surrounding electrode 370c. In addition, the surrounding electrode 370d is formed along the bottom surface of the base substrate so as to collectively surround the group of the end surfaces 365a of the electrodes 365 disposed within the peripheral region 362d. A via electrode 371d penetrating the base substrate is connected to the surrounding electrode 370d. In addition, the surrounding electrode 370e is formed along the bottom surface of the base substrate so as to collectively surround the group of the end surfaces 365a of the electrodes 365 disposed within the region 361. A via electrode 371e penetrating the base substrate is connected to the surrounding electrode 370e. The high frequency oscillator 171 is electrically connected to each of the via electrodes 371a to 371e, and the high frequency signal is applied to each of the surrounding electrodes 370a to 370e. In the second sensor 505, the surrounding electrode among the surrounding electrodes 370a to 370e surrounding a group of the end surfaces 365a of the electrodes 365 shields the group of the end surfaces 365a of the electrodes 365 from the outside of the surrounding electrode. Therefore, in measuring the electrostatic capacities, directivity of the second sensor 505 is improved.

Hereinbefore, various embodiments have been described. However, various modifications may be made without being limited to the above-described embodiments. For example, as an example of the process modules PM1 to PM6, the plasma processing apparatus is exemplified. The process modules PM1 to PM6 may be an arbitrary processing apparatus as long as the electrostatic chuck and the focus ring can be utilized therein. In addition, the above-described plasma processing apparatus 10 is the capacitive coupling-type plasma processing apparatus. However, the plasma processing apparatus which can be utilized as the process modules PM1 to PM6 may be an arbitrary plasma processing apparatus such as an inductive coupling-type plasma processing apparatus and a plasma processing apparatus utilizing a surface wave such as a microwave.

In addition, in the above-described embodiments, the positional relationship between each of the bottom electrodes of the plurality of second sensors and the central axis AX100 of the measuring instrument 100 substantially coincides with the positional relationship between the central axis of the placement stage PD and the lift pin 25a. However, the positional relationship between each of the bottom electrodes of the plurality of second sensors and the central axis AX100 of the measuring instrument 100 is not limited thereto. For example, the distance between each of the bottom electrodes of the plurality of second sensors and the central axis AX100 of the measuring instrument 100 may substantially coincide with the distance between the central axis of the placement stage PD and the edge of the electrostatic chuck.

Figure 17:
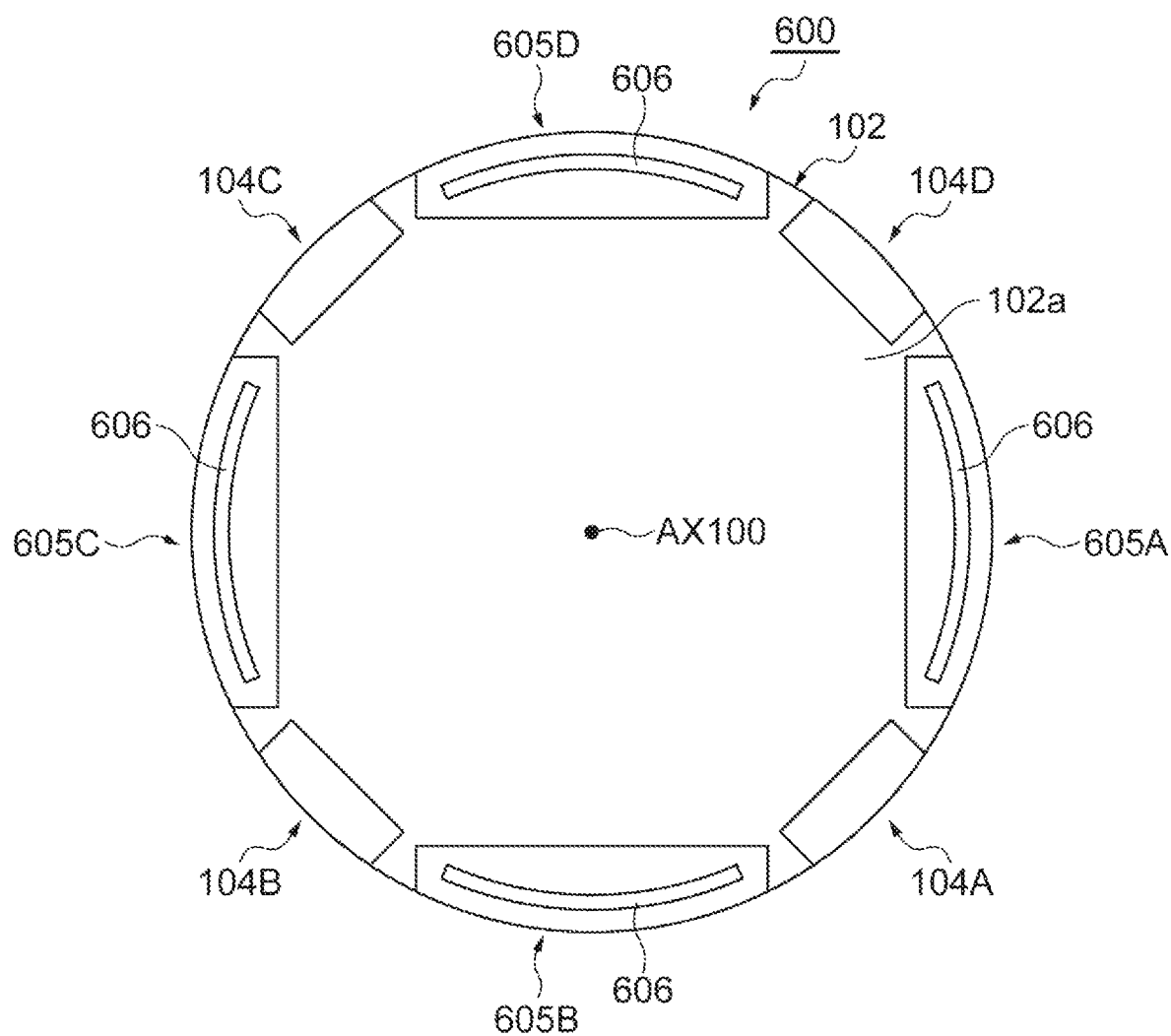
FIG. 17 is a view illustrating another example of the measuring instrument.

Hereinafter, a measuring instrument according to another such embodiment will be described. That is, description will be given regarding a measuring instrument in which the distance between each of the bottom electrodes of the plurality of second sensors and the central axis AX100 of the measuring instrument substantially coincides with the distance between the central axis of the placement stage PD and the edge of the electrostatic chuck. The measuring instrument according to another embodiment can also be used in the processing system illustrated in FIG. 1. FIG. 17 illustrates a plan view of the measuring instrument viewed from the bottom surface side. A measuring instrument 600 illustrated in FIG. 17 includes the base substrate 102. Four first sensors 104A to 104D for measuring an electrostatic capacity are provided in the lower portion 102a of the base substrate 102. In addition, in place of the second sensors 105A to 105C illustrated in FIG. 6, four second sensors 605A to 605D are provided in the lower portion 102a of the base substrate 102. The number of second sensors provided in the measuring instrument 600 can be an arbitrary number of three or more. The second sensors 605A to 605D are disposed along a circle sharing the central axis AX100 of the base substrate 102 at equal distances in the circumferential direction. In addition, the second sensors 605A to 605D and the first sensors 104A to 104D are alternately arranged in the circumferential direction. Each of the four second sensors 605A to 605D has a bottom electrode 606 provided along the bottom surface of the base substrate 102.

Figure 18:
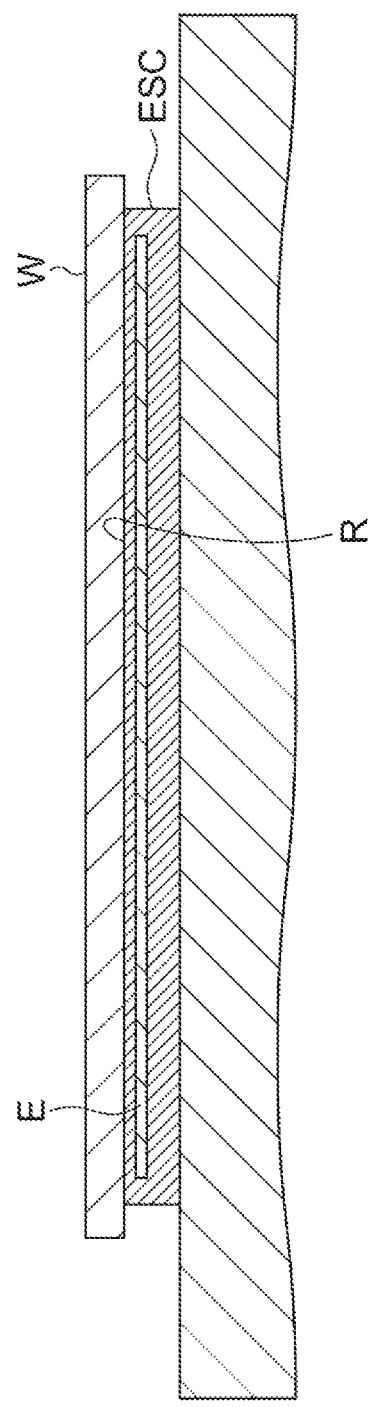
FIG. 18 is a cross-sectional view schematically illustrating an exemplary electrostatic chuck.

FIG. 18 is a cross-sectional view of the electrostatic chuck and illustrates a state where the workpiece is placed on the electrostatic chuck. In one embodiment, the electrostatic chuck ESC has a structure in which an electrode E formed with a conductive film is disposed between a pair of insulating layers or insulating sheets, and the electrostatic chuck ESC has a substantial disk shape. The electrostatic chuck ESC has a placement region R on which the workpiece W and the measuring instrument 600 are placed. The placement region R has a circular edge. The workpiece W and the measuring instrument 600 have outer diameters greater than the outer diameter of the placement region R.

Figure 19:
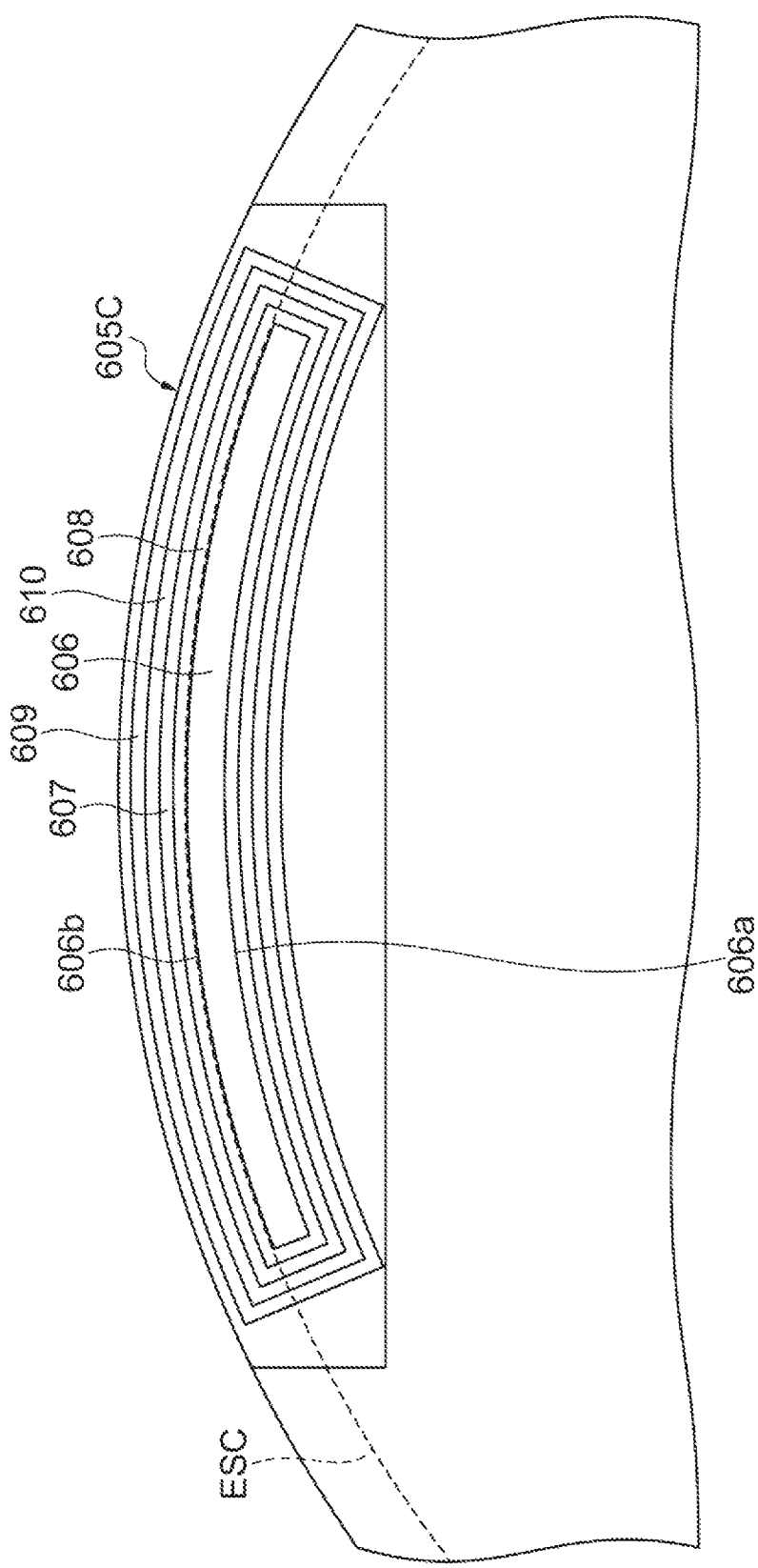
FIG. 19 is an enlarged view of the measuring instrument in FIG. 17.

FIG. 19 is a partially enlarged view of FIG. 17 and illustrates one second sensor. The edge of the bottom electrode 606 has a partially arc shape. That is, the bottom electrode 606 has a planar shape which is defined by two arcs 606a and 606b having the central axis AX100 as the center and having radii different from each other. The arcs 606b on the outer side in the radial direction in the bottom electrodes 606 of the plurality of second sensors 605A to 605D extend on a common circle. In addition, the arcs 606a on the inner side in the radial direction in the bottom electrodes 606 of the plurality of second sensors 605A to 605D extend on another common circle. The curvature of a portion of the edge of the bottom electrode 606 coincides with the curvature of the edge of the electrostatic chuck ESC (placement region R). In one embodiment, the curvature of the arc 606b forming the edge on the outer side in the radial direction in the bottom electrode 606 coincides with the curvature of the edge of the placement region R of the electrostatic chuck ESC. The curvature center of the arc 606b, that is, the center of a circle on which the arc 606b extends shares the central axis AX100.

In one embodiment, each of the second sensors 605A to 605D further includes an electrode 607 surrounding the bottom electrode 606. The electrode 607 has a frame shape and surrounds the bottom electrode 606 over the whole circumference. The electrode 607 and the bottom electrode 606 are separated from each other such that an insulating region 608 is interposed therebetween. In addition, in one embodiment, each of the second sensors 605A to 605D further includes an electrode 609 surrounding the electrode 607 outside the electrode 607. The electrode 609 has a frame shape and surrounds the electrode 607 over the whole circumference. The electrode 607 and the electrode 609 are separated from each other such that an insulating region 610 is interposed therebetween.

Figure 20:
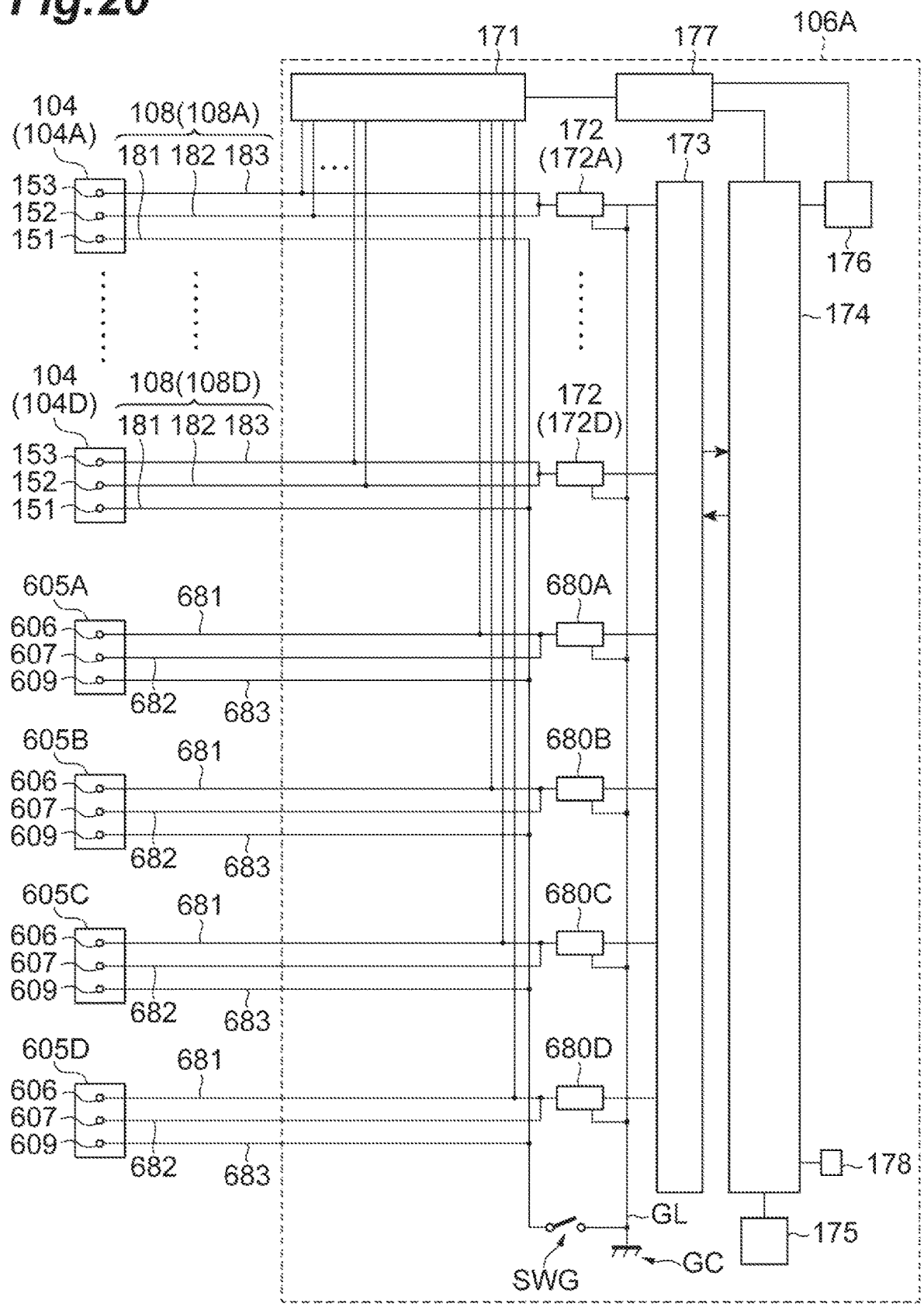
FIG. 20 is a view illustrating a configuration of the circuit board of the measuring instrument in FIG. 17.

FIG. 20 is a view illustrating a configuration of the circuit board of the measuring instrument. The measuring instrument 600 has a circuit board 106A. The circuit board 106A corresponds to the circuit board 106 in the measuring instrument 100. As illustrated in FIG. 20, the circuit board 106A has the high frequency oscillator 171, the plurality of C/V conversion circuits 172A to 172D, a plurality of C/V conversion circuits 680A to 680D, the A/D converter 173, the processor 174, the storage device 175, the communication device 176, the power source 177, and the storage device 178.

The bottom electrode 606 of each of the second sensors 605A to 605D is connected to the corresponding C/V conversion circuit among the C/V conversion circuits 680A to 680D via a corresponding wiring 681. In addition, the electrode 607 of each of the second sensors 605A to 605D is connected to the corresponding C/V conversion circuit among the C/V conversion circuits 680A to 680D via a corresponding wiring 682. The bottom electrode 606 and the electrode 607 of each of the second sensors 605A to 605D are electrically connected to the high frequency oscillator 171 such that the high frequency signal from the high frequency oscillator 171 can be applied thereto. Each of the C/V conversion circuits 680A to 680D is configured to generate the voltage signal indicating the electrostatic capacity of the electrode connected to the input thereof, based on the voltage amplitude in the input, and to output the voltage signal. In addition, the electrode 609 of each of the second sensors 605A to 605D is connected to the ground potential line GL via a corresponding wiring 683. The wiring 683 may be connected to the ground potential line GL via the switch SWG.

The outputs of the plurality of C/V conversion circuits 680A to 680D are connected to the input of the A/D converter 173. Accordingly, the A/D converter 173 generates digital values (measurement values) indicating the electrostatic capacities of the bottom electrodes 606. The A/D converter 173 outputs the generated digital values to the processor 174.

Figure 21:
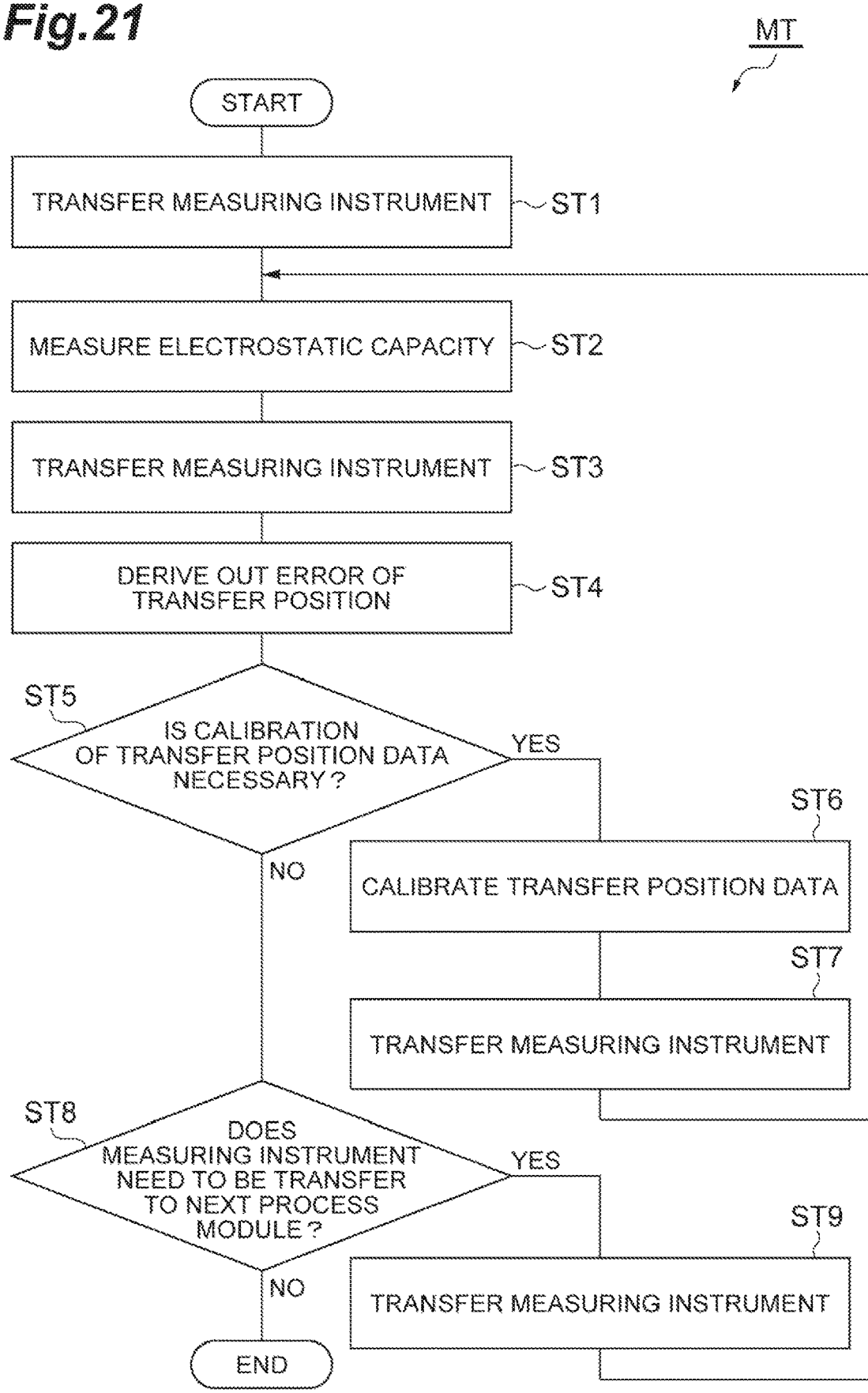
FIG. 21 is a flow chart illustrating an exemplary embodiment of a method of calibrating transfer position data in the processing system.

Hereinafter, a method of calibrating transfer position data in the processing system 1 by using the measuring instrument 600 will be described. As described above, the transfer unit TU2 in the processing system 1 is controlled by the controller MC. In the embodiment, the transfer unit TU2 can transfer the workpiece W and the measuring instrument 600 to a location on the placement region R of the electrostatic chuck ESC based on the transfer position data transmitted from the controller MC. FIG. 21 is a flow chart illustrating a calibration method of the transfer unit of the processing system according to the embodiment.

In a method MT illustrated in FIG. 21, first, a step ST1 is executed. In the step ST1, the measuring instrument 600 is transferred by the transfer unit TU2 to a position on the placement region R which is particularized by the transfer position data. Specifically, the transfer unit TU1 transfers the measuring instrument 600 to one load lock module out of the load lock module LL1 and the load lock module LL2. The transfer unit TU2 transfers the measuring instrument 600 to any of the process modules PM1 to PM6 from the one load lock module based on the transfer position data, and the measuring instrument 600 is placed on the placement region R of the electrostatic chuck ESC. For example, the transfer position data is coordinate data which is set in advance such that the position of the central axis AX100 of the measuring instrument 600 coincides with the central position of the placement region R.

In a succeeding step ST2, the measuring instrument 600 measures the electrostatic capacities. Specifically, the measuring instrument 600 acquires a plurality of digital values (measurement values) depending on the volume of the electrostatic capacities between the placement region R of the electrostatic chuck ESC and the bottom electrodes 606 of the second sensors 605A to 605D, thereby storing the plurality of digital values in the storage device 175. The plurality of digital values can be acquired at timing set in advance under the control of the processor 174. In one embodiment, measurement of the electrostatic capacities by the first sensors 104A to 104D may be executed at timing of measurement of the electrostatic capacities by the second sensors 605A to 605D.

In a succeeding step ST3, the measuring instrument 600 is transferred out from the process module and returns to any of the transfer module TF, the load lock modules LL1 or LL2, the loader module LM, and any of the containers 4a to 4d. In a succeeding step ST4, the error between the position on the placement region R to which the measuring instrument 600 is transferred and a predetermined transfer position on the placement region R is derived out. The predetermined transfer position can be the central position of the placement region R. In a step ST4 of one embodiment, first, the plurality of digital values stored in the storage device 175 are transmitted to the controller MC. The plurality of digital values may be transmitted from the communication device 176 to the controller MC in accordance with a command from the controller MC. Otherwise, the plurality of digital values may be transmitted to the controller MC at predetermined timing in accordance with the control of the processor 174 performed based on counting of a timer provided in the circuit board 106A. Subsequently, the controller MC derives out the error of the transfer position of the measuring instrument 600 based on the plurality of received digital values. In one embodiment, the controller MC has a data table showing a relationship between the transfer position of the measuring instrument 600 on the placement region R and digital values acquired by the second sensors 605A to 605D. In the data table, for example, a relationship between the position of the bottom electrode 606 in the placement region R in each radial direction and a digital value indicating the electrostatic capacity of the bottom electrode 606 at the position is registered.

FIGS. 22A, 22B, and 22C are views illustrating the transfer position of the measuring instrument with respect to the placement region of the electrostatic chuck. FIG. 22A illustrates the positional relationship between the placement region R and one bottom electrode 606 in a case where the measuring instrument 600 is transferred to the predetermined transfer position. FIGS. 22B and 22C illustrate the positional relationship between the placement region R and one bottom electrode 606 in a case where the measuring instrument 600 is transferred while deviating from the predetermined transfer position. As illustrated in FIG. 22B, in a case where the bottom electrode 606 deviates outward from the placement region R in the radial direction of the placement region R, the electrostatic capacity measured by the bottom electrode 606 becomes smaller compared to the electrostatic capacity in a case where the measuring instrument 600 is transferred to the predetermined transfer position (FIG. 22A). As illustrated in FIG. 22C, in a case where the bottom electrode 606 deviates inward in the placement region R in the radial direction of the placement region R, due to the influence of the electrode E, the electrostatic capacity measured by the bottom electrode 606 becomes greater compared to the electrostatic capacity in a case where the measuring instrument 600 is transferred to the predetermined transfer position (FIG. 22A). Therefore, with reference to the data table while using the digital value indicating the electrostatic capacity of the bottom electrode 606 of each of the second sensors 605A to 605D, the amount of deviation of each bottom electrode 606 in each radial direction of the placement region R can be obtained. Based on the amount of deviation of the bottom electrode 606 of each of the second sensors 605A to 605D in each radial direction, the error of the transfer position of the measuring instrument 600 can be obtained.

In a case where the error of the transfer position of the measuring instrument 600 is greater than a predetermined threshold value, in a succeeding step ST5, it is determined that calibration of the transfer position data is necessary. In this case, in a step ST6, the transfer position data is revised by the controller MC such that the error is eliminated. In a step ST7, the measuring instrument 600 is transferred again to the same process module as the process module to which the measuring instrument 600 has been transferred immediately before, and the steps ST2 to ST5 are executed again. Meanwhile, in a case where the error of the transfer position of the measuring instrument 600 is smaller than the predetermined threshold value, in the step ST5, it is determined that calibration of the transfer position data is not necessary. In this case, in a step ST8, it is determined whether or not the measuring instrument 600 is transferred to a different process module to which the measuring instrument 600 is to be transferred next. In a case where a different process module to which the measuring instrument 600 is to be transferred next remains, in a succeeding step ST9, the measuring instrument 600 is transferred to the different process module, and the steps ST2 to ST5 are executed. Meanwhile, in a case where no different process module to which the measuring instrument 600 is to be transferred next remains, the method MT ends.

As described above, according to the method MT using the measuring instrument 600, the measuring instrument 600 provides the plurality of digital values which can be utilized in calibrating the transfer position data utilized in transfer performed by the transfer unit TU2. When the plurality of digital values are used, the transfer position data can be calibrated as necessary. When the transfer position data calibrated in such a manner is used in transfer of the workpiece W by the transfer unit TU2, the workpiece W can be transferred to the predetermined transfer position.

In addition, in one embodiment, the bottom electrode 606 of each of the second sensors 605A to 605D is disposed along a circle sharing the central axis AX100 of the base substrate 102. In a case where the measuring instrument 600 is transferred such that the central axis AX100 of the base substrate 102 coincides with the center of the placement region R which is the predetermined transfer position, the digital values indicating the electrostatic capacities of the bottom electrodes 606 of the second sensors 605A to 605D ideally become the same as each other. Therefore, the error of the transfer position of the measuring instrument 600 can be easily obtained.

In addition, a portion of the edge of the bottom electrode 606 of each of the second sensors 605A to 605D has an arc shape and extends on the circle having a diameter which substantially coincides with the diameter of the placement region R. In addition, the curvature of the portion of the edge of the bottom electrode 606 coincides with the curvature of the edge of the placement region R. Therefore, the amount of deviation between the transfer position of the measuring instrument 600 and the predetermined transfer position in each radial direction can be accurately measured.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A measuring instrument comprising: a base substrate having a disk shape; a plurality of first sensors mounted on the base substrate, arranged along an edge of the base substrate, and respectively providing a plurality of side electrodes, the side electrodes being provided in the respective first sensors and arranged along the edge of the base substrate; one or more second sensors each of which has a bottom electrode provided in the base substrate and provided along a bottom surface of the base substrate; and a circuit board mounted on the base substrate and connected to each of the plurality of first sensors and the one or more second sensors, the circuit board being configured to apply a high frequency signal to the plurality of side electrodes and the bottom electrode, to generate a plurality of first measurement values based on voltage amplitudes in the plurality of side electrodes in response to the high frequency signal, and to generate a second measurement value based on a voltage amplitude in the bottom electrode in response to the high frequency signal, wherein each of the one or more second sensors includes a plurality of electrodes provided in the base substrate to extend in a plate-thickness direction of the base substrate from a top surface of the base substrate, and the bottom electrode of each of the one or more second sensors is formed with end surfaces of the plurality of electrodes on a side of the bottom surface.

2. The measuring instrument according to claim 1, wherein
the bottom electrode of each of the one or more second sensors has a circle shape,
each of the one or more second sensors further includes peripheral electrodes disposed to surround the bottom electrode, and
the circuit board is further configured to apply the high frequency signal to the peripheral electrodes and to generate third measurement values based on voltage amplitudes in the peripheral electrodes in response to the high frequency signal.

3. The measuring instrument according to claim 1, wherein
the one or more second sensors are a plurality of the second sensors, and
the plurality of second sensors are disposed along a circle sharing a central axis of the base substrate.

4. The measuring instrument according to claim 1, wherein
each of the one or more second sensors further includes one or more through electrodes penetrating the base substrate, and
the bottom electrode of each of the one or more second sensors is connected to the circuit board via the one or more through electrodes.

5. The measuring instrument according to claim 1, wherein
the one or more second sensors are three or more second sensors,
each of the three or more second sensors has the bottom electrode provided along the bottom surface of the base substrate and is disposed along a circle sharing a central axis of the base substrate, and
a portion of an edge of the bottom electrode of each of the three or more second sensors has an arc shape and extends on the circle.

6. A method of calibrating transfer position data in a processing system by using the measuring instrument according to claim 5, wherein
the processing system includes:
a processing apparatus having a chamber body and an electrostatic chuck provided inside a chamber provided by the chamber body, the electrostatic chuck having a placement region which has a circular edge and on which a workpiece is to be placed; and
a transfer unit configured to transfer the workpiece to a location on the placement region based on the transfer position data, and
the method comprises:
transferring the measuring instrument by using the transfer unit to a position on the placement region identified by the transfer position data;
measuring three or more electrostatic capacities by using the three or more second sensors of the measuring instrument transferred to a location on the placement region;
obtaining an error of the position on the placement region to which the measuring instrument is transferred, with respect to a predetermined transfer position on the placement region based on the measurement values of the three or more electrostatic capacities; and
calibrating the transfer position data by using the error.

7. The method according to claim 6, wherein
a curvature of the portion of the edge of the bottom electrode coincides with a curvature of the edge of the placement region.

8. An instrument, comprising: a base substrate; a plurality of first sensors mounted on the base substrate and disposed at an edge of the base substrate, each of the first sensors including at least one first electrode; a plurality of second sensors mounted on the base substrate and disposed at a bottom of the base substrate, each of the second sensors including at least one second electrode; and a circuitry mounted on the base substrate, the circuitry being electrically connected to the first and second sensors, the circuitry including an oscillator and a processor, the oscillator being connected between the processor and each of the first and second sensors, the oscillator being configured to apply a high frequency signal to the at least one first electrode in each of the first sensors and the at least one second electrode in each of the second sensors, the processor being configured to acquire at least one first measurement value from the at least one first electrode in each of the first sensors during applying the high frequency signal to the at least one first electrode by the oscillator and acquire at least one second measurement value from the at least one second electrode in each of the second sensors during applying the high frequency signal to the at least one second electrode by the oscillator, wherein each of the plurality of second sensors includes a plurality of electrodes provided in the base substrate to extend in a plate-thickness direction of the base substrate from a top surface of the base substrate, and the at least one second electrode of each of the plurality of second sensors is formed with end surfaces of the plurality of electrodes on a side of the bottom of the base substrate.

9. The instrument according to claim 8, wherein
each of the second sensors further includes third electrodes disposed to surround the at least one second electrode, and
the circuitry is further configured to apply the high frequency signal to the third electrodes and to generate third measurement values based on voltage amplitudes in the third electrodes in response to the high frequency signal.

10. The instrument according to claim 8, wherein
the plurality of second sensors are disposed along a circle around a central axis of the base substrate.

11. The instrument according to claim 8, wherein
each of the second sensors further includes one or more through electrodes penetrating the base substrate, and
the at least one second electrode of each of the second sensors is connected to the circuitry via the one or more through electrodes.

12. The instrument according to claim 8, wherein
the second sensors are three or more second sensors,
each of the second sensors is disposed along a circle around a central axis of the base substrate, and
a portion of an edge of the at least one second electrode of each of the second sensors has an arc shape and extends on the circle.

* * * * *